(12) United States Patent
Lin et al.

(10) Patent No.: US 12,261,170 B2
(45) Date of Patent: Mar. 25, 2025

(54) SEMICONDUCTOR DEVICES AND METHODS OF MANUFACTURING THEREOF

(71) Applicant: Taiwan Semiconductor Manufacturing Company Limited, Hsinchu (TW)

(72) Inventors: Shih-Yao Lin, New Taipei (TW); Hsiao Wen Lee, Hsinchu (TW); Yu-Shan Cheng, Hsinchu (TW); Ming-Ching Chang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/344,580

(22) Filed: Jun. 29, 2023

(65) Prior Publication Data
US 2023/0352479 A1    Nov. 2, 2023

Related U.S. Application Data

(62) Division of application No. 17/145,830, filed on Jan. 11, 2021, now Pat. No. 11,721,693.

(51) Int. Cl.
*H01L 27/088* (2006.01)
*H01L 21/8234* (2006.01)

(52) U.S. Cl.
CPC .... *H01L 27/088* (2013.01); *H01L 21/823418* (2013.01); *H01L 21/823456* (2013.01); *H01L 21/823481* (2013.01)

(58) Field of Classification Search
CPC .............. H01L 21/823481; H01L 21/823878
See application file for complete search history.

(56) References Cited

U.S. PATENT DOCUMENTS

| 10,825,736 | B1 | 11/2020 | Zhang et al. |
| 2013/0309838 | A1 | 11/2013 | Wei et al. |
| 2017/0229555 | A1* | 8/2017 | Balakrishnan ...... H01L 29/7853 |

(Continued)

OTHER PUBLICATIONS

Non-Final Office Action on U.S. Appl. No. 17/145,830 DTD Jun. 22, 2022.

(Continued)

*Primary Examiner* — John A Bodnar
(74) *Attorney, Agent, or Firm* — FOLEY & LARDNER LLP

(57) ABSTRACT

A semiconductor device includes a plurality of first stack structures formed in a first area of a substrate, wherein the plurality of first stack structures are configured to form a plurality of first transistors that operate under a first voltage level. The semiconductor device includes a plurality of second stack structures formed in a second area of the substrate, wherein the plurality of second stack structures are configured to form a plurality of second transistors that operate under a second voltage level greater than the first voltage level. The semiconductor device includes a first isolation structure disposed between neighboring ones of the plurality of first stack structures and has a first height. The semiconductor device includes a second isolation structure disposed between neighboring ones of the plurality of second stack structures and has a second height. The first height is greater than the second height.

20 Claims, 24 Drawing Sheets

(56) References Cited

U.S. PATENT DOCUMENTS

| | | | |
|---|---|---|---|
| 2017/0256608 A1* | 9/2017 | Suk | H01L 29/6656 |
| 2017/0278842 A1* | 9/2017 | Song | H01L 21/823431 |
| 2017/0365522 A1 | 12/2017 | Jeong et al. | |
| 2018/0315752 A1* | 11/2018 | Fan | H01L 29/0649 |
| 2019/0043857 A1* | 2/2019 | Wu | H01L 27/0886 |
| 2020/0006333 A1 | 1/2020 | Noh et al. | |

OTHER PUBLICATIONS

Office Action on TW Application No. 110132539 dated Nov. 22, 2024.

\* cited by examiner

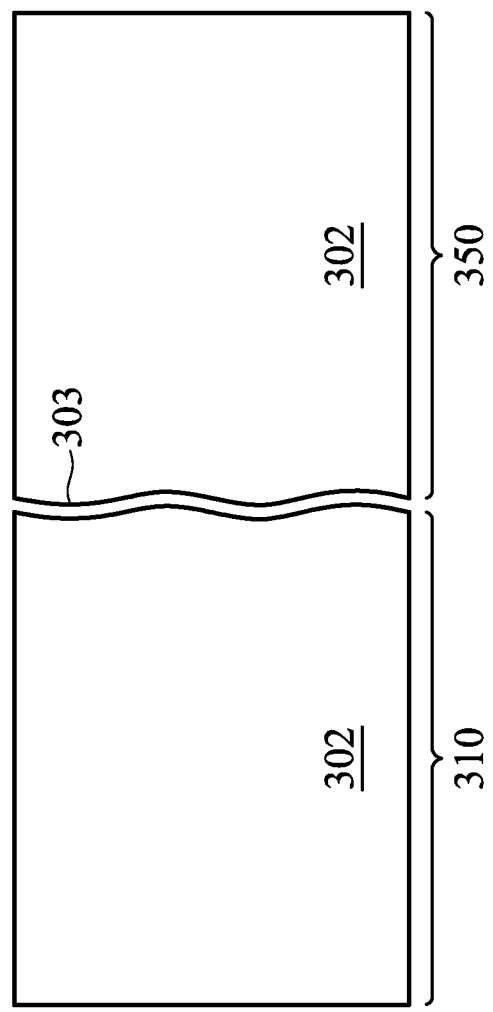

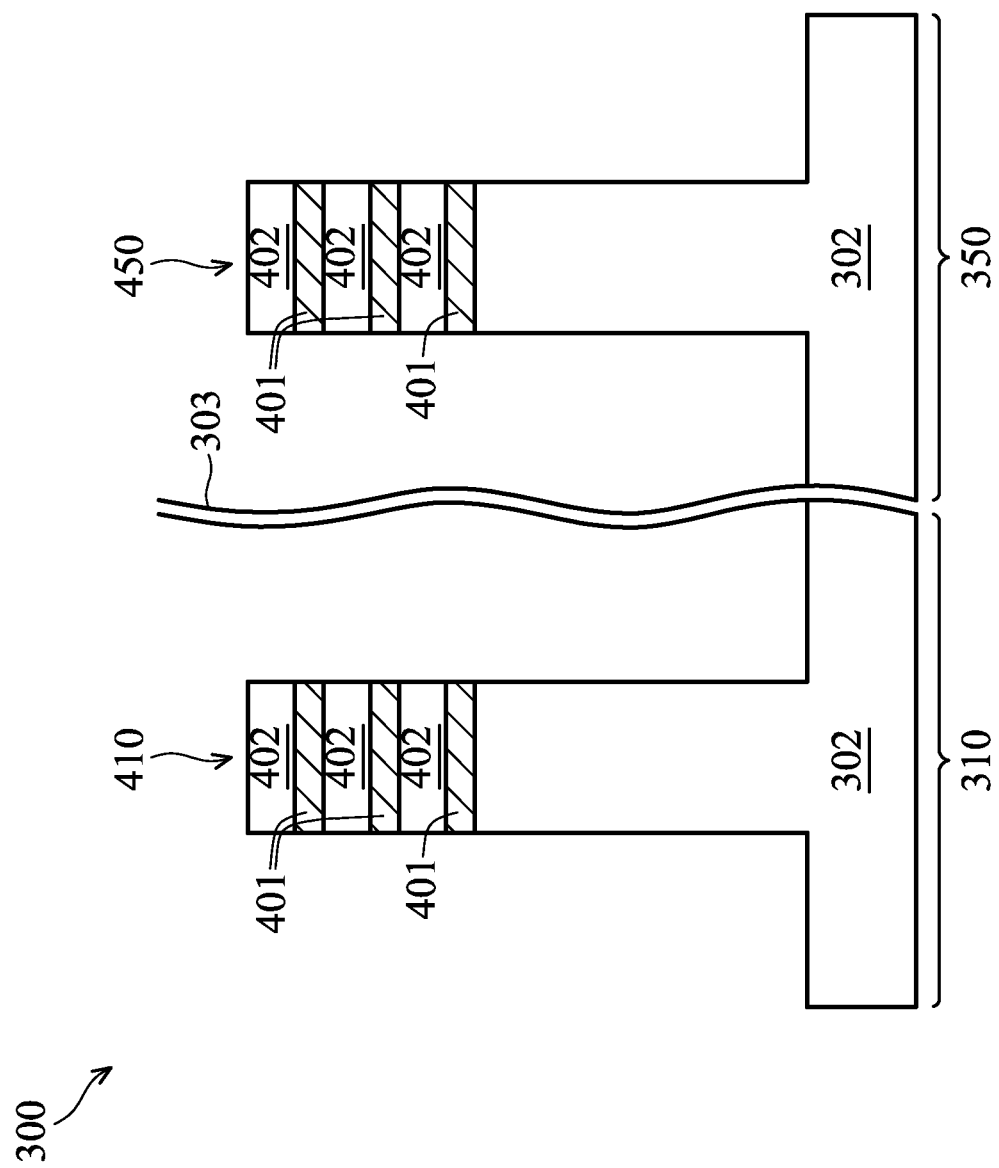

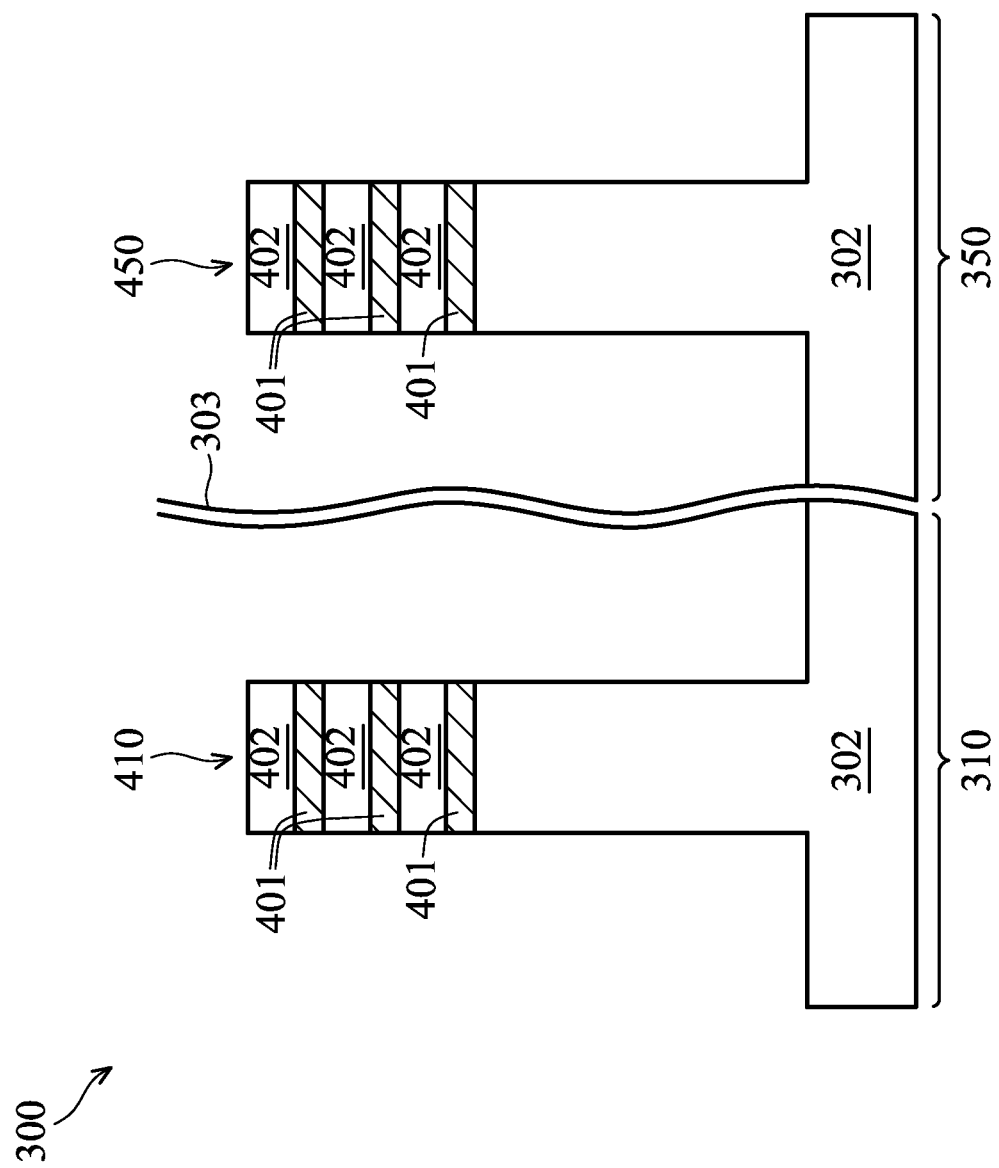

SEMICONDUCTOR DEVICES AND METHODS OF MANUFACTURING THEREOF

CROSS-REFERENCE TO RELATED APPLICATIONS

This application is related to and claims priority as a divisional of U.S. Utility application Ser. No. 17/145,830, filed on Jan. 11, 2021, titled "SEMICONDUCTOR DEVICES AND METHODS OF MANUFACTURING THEREOF," the entire contents of which are incorporated herein by reference for all purposes.

BACKGROUND

The present disclosure generally relates to semiconductor devices, and particularly to methods of making a non-planar transistor device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4A, 4B, 4C, 5A, 5B, 5C, 6A, 6B, 6C, 7A, 7B, 7C, 8A, 8B, 8C, 9A, 9B, 9C, 10A, 10B, and 10C illustrate cross-sectional views of an example GAA FET device (or a portion of the example GAA FET device) during various fabrication stages, made by the method of FIG. 2, in accordance with some embodiments.

DETAILED DESCRIPTION

Figure 1:
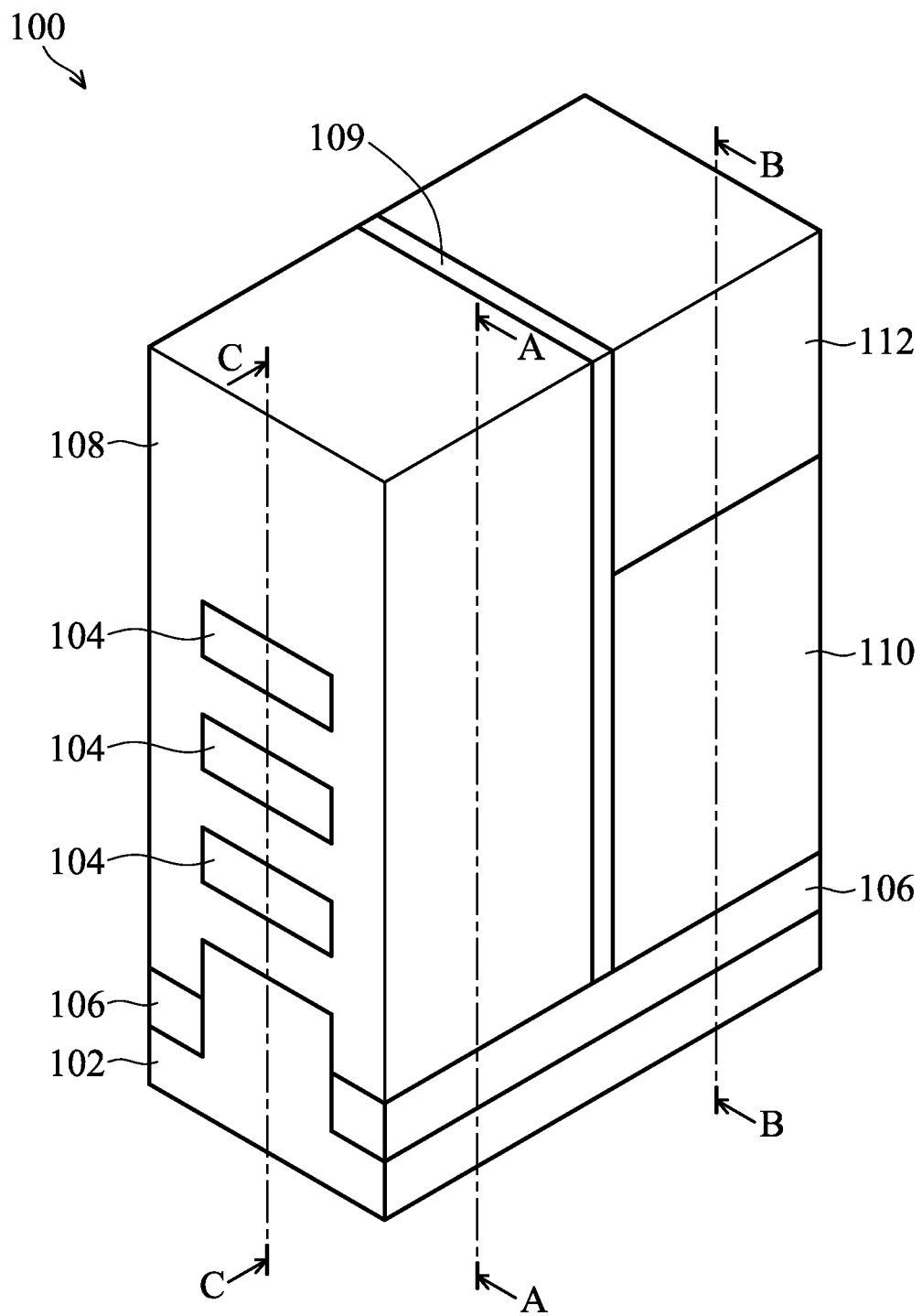
FIG. 1 illustrates a perspective view of a gate-all-around (GAA) field-effect-transistor (FET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, an integrated circuit includes various types of circuits formed on a substrate. Some of the circuits are configured to operate under a higher voltage/current, while some of the circuits are configured to operate under a lower voltage/circuit. To achieve such a goal, in the existing technologies, different circuits are configured in their respective functions in a circuit level. Few characteristics in a device (or transistor) level can be configured. For example, although transistors that form the respective circuits that function differently, most of the intrinsic features (e.g., the respective heights of metal gate structures, the respective heights of source/drain structures, etc.) may be formed the same, which in turn increases design complexity of the integrated circuit. Thus, the existing technologies to fabricate integrated circuits have not been entirely satisfactory.

Embodiments of the present disclosure are discussed in the context of forming a gate-all-around (GAA) field-effect-transistor (FET) device, and in particular, in the context of forming a number of GAA transistors, which are characterized with different dimensions of their respective features. For example, a first group of GAA transistors may have a relatively higher metal gate structures and/or a relatively higher source/drain structures; and a second group of GAA transistors may have a relatively shorter metal gate structures and/or a relatively shorter source/drain structures. As such, the first group of transistors and the second group of transistors may be allowed to operate under different conditions (e.g., voltage levels, current levels). In some embodiments, such different dimensions of the transistor features can be formed by at least adjusting respective heights of isolation structures formed between the first group of transistors and between the second group of transistors.

FIG. 1 illustrates a perspective view of an example GAA FET device 100, in accordance with various embodiments. The GAA FET device 100 includes a substrate 102 and a number of semiconductor layers (e.g., nanosheets, nanowires, or otherwise nanostructures) 104 above the substrate 102. The semiconductor layers 104 are vertically separated from one another, which can collectively function as a (conduction) channel of the GAA FET device 100. Isolation regions/structures 106 are formed on opposing sides of a protruding portion of the substrate 102, with the semiconductor layers 104 disposed above the protruding portion. A gate structure 108 wraps around each of the semiconductor layers 104 (e.g., a full perimeter of each of the semiconductor layers 104). A spacer 109 extends along each sidewall of the gate structure 108. Source/drain structures are disposed on opposing sides of the gate structure 108 with the spacer 109 disposed therebetween, e.g., source/drain structure 110 shown in FIG. 1. An interlayer dielectric (ILD) 112 is disposed over the source/drain structure 110.

The GAA FET device shown in FIG. 1 is simplified, and thus, it should be understood that one or more features of a completed GAA FET device may not be shown in FIG. 1.

For example, the other source/drain structure opposite the gate structure 108 from the source/drain structure 110 and the ILD disposed over such a source/drain structure are not shown in FIG. 1. Further, FIG. 1 is provided as a reference to illustrate a number of cross-sections in subsequent figures. As indicated, cross-section A-A is cut along a longitudinal axis of the gate structure 108; cross-section B-B, parallel to cross-section A-A, is cut across the source/drain structure 110; and cross-section C-C is cut along a longitudinal axis of the semiconductor layers 104 and in a direction of a current flow between the source/drain structures. Subsequent figures refer to these reference cross-sections for clarity.

Figure 2:
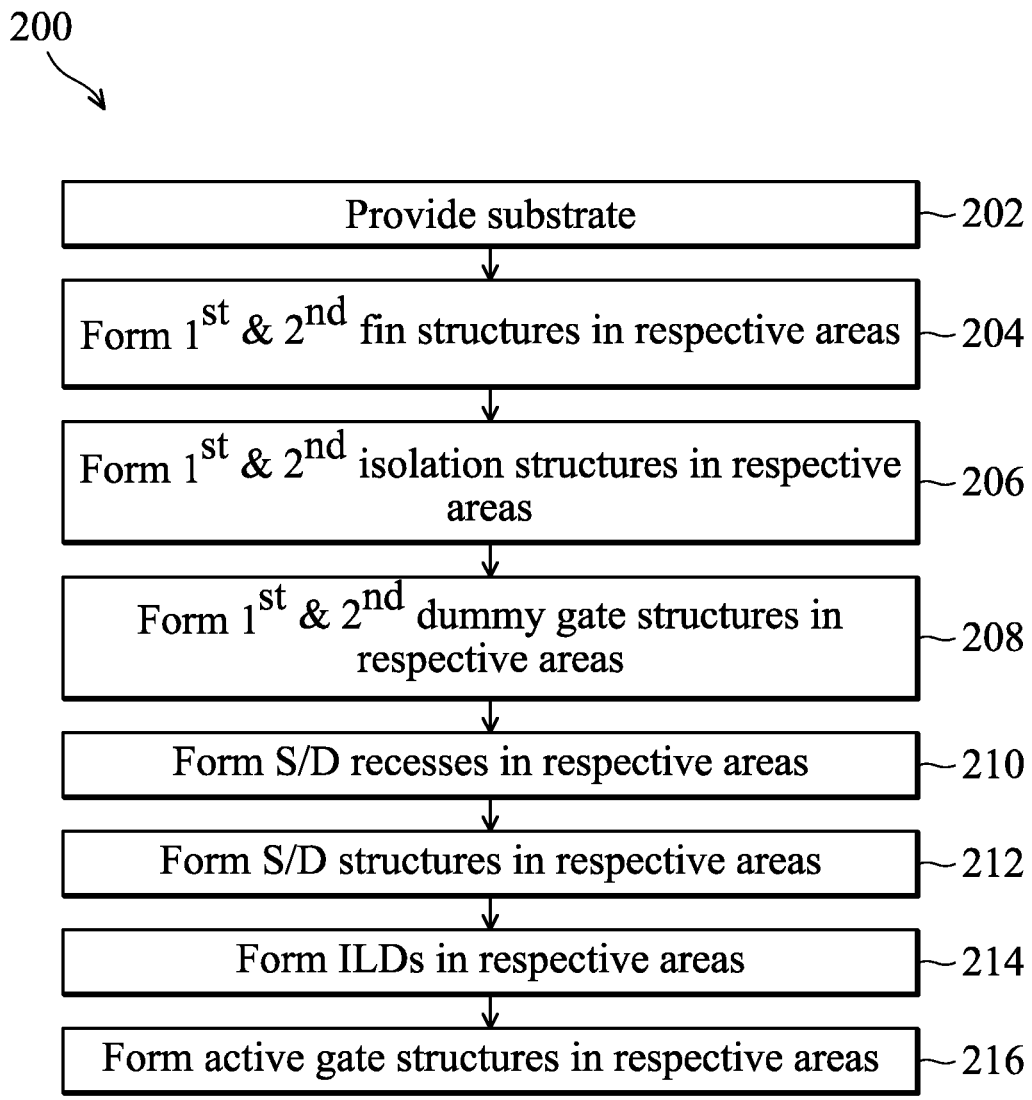
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device, a GAA FET device (e.g., GAA FET device 100), a nanosheet transistor device, a nanowire transistor device, a vertical transistor device, a gate-all-around (GAA) transistor device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example GAA FET device at various fabrication stages as shown in FIGS. 3, 4A, 4B, 4C, 5A, 5B, 5C, 6A, 6B, 6C, 7A, 7B, 7C, 8A, 8B, 8C, 9A, 9B, 9C, 10A, 10B, and 10C, respectively, which will be discussed in further detail below.

In brief overview, the method 200 starts with operation 202 of providing a substrate. The method 200 continues to operation 204 of forming a first fin structure in a high density area and a second fin structure in a low density area, each of which includes a number of first semiconductor layers and a number of second semiconductor layers. The method 200 continues to operation 206 of forming a first isolation structure in the high density area and a second isolation structure in the low density area. The method 200 continues to operation 208 of forming a first dummy gate structure in the high density area and a second dummy gate structure in the low density area. The method 200 continues to operation 210 of forming source/drain recesses in the high density area and low density area, respectively. The method 200 continues to operation 212 of forming source/drain structures in the high density area and low density area, respectively. The method 200 continues to operation 214 of forming a first interlayer dielectric (ILD) and a second ILD in the high density area and low density area, respectively. The method 200 continues to operation 216 of forming a first active gate structure and a second active gate structure in the high density area and low density area, respectively.

As mentioned above, FIGS. 3-10C each illustrate, in a cross-sectional view, a portion of a GAA FET device 300 at various fabrication stages of the method 200 of FIG. 2. The GAA FET device 300 is similar to the GAA FET device 100 shown in FIG. 1, but with certain features/structures/regions not shown, for the purposes of brevity. For example, the following figures of the GAA FET device 300 do not include source/drain structures (e.g., 110 of FIG. 1). It should be understood the GAA FET device 300 may further include a number of other devices (not shown in the following figures) such as inductors, fuses, capacitors, coils, etc., while remaining within the scope of the present disclosure.

Corresponding to operation 202 of FIG. 2, FIG. 3 is a cross-sectional view of the GAA FET device 300 including a semiconductor substrate 302 at one of the various stages of fabrication. The cross-sectional view of FIG. 3 is cut in a direction along the lengthwise direction of an active/dummy gate structure of the GAA FET device 300 (e.g., cross-section A-A indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the substrate 302 can include areas 310 and 350. The area 310 can be configured to form a number of transistors in a relatively high gate density (which is sometimes referred to as "high density area 310"); and the area 350 can be configured to form a number of transistors in a relatively low gate density (which is referred to as "low density area 350"). Accordingly, features (e.g., fins) of the transistors in the low density area 350 may be more sparsely formed, when compared to features (e.g., fins) of the transistors formed in the high density area 310. In various embodiments, the transistors formed in the high density area 310 may function as, for example, logic circuits, static random access memory (SRAM) circtuis, and/or ring oscillators (ROs). Such transistors formed in the area 310 may sometimes be referred to as core transistors. The transistors formed in the low density area 350 may functions as, for example, input/output (I/O) circuits, and/or serializer/deserializer (SerDes). Such transistors formed in the area 350 may sometimes be referred to as I/O transistors.

As shown in FIG. 3 (and the following figures), the high density area 310 and low density area 350 are separated from each other by a divider 303, which can include additional features/components/devices that are omitted for simplicity. It should be appreciated that some of the operations of the method 200 may be concurrently performed in the areas 310 and 350. For purposes of illustration, the feature(s) formed in the areas 310 and 350 may be shown in the same figure that corresponds to one of the operations of the method 200.

In general, the terms "I/O transistor" and "core transistor," as used herein, may be generally referred to a transistor configured to operate under a relatively higher voltage (e.g., higher $V_{gs}$) and a transistor configured to operate under a relatively lower voltage (e.g., lower $V_{gs}$), respectively. Thus, it should be understood that the I/O transistor can include any of various other transistors operating under a relatively higher voltage and the core transistor can include any of various other transistors operating under a relatively lower voltage, while remaining within the scope of the present disclosure. In accordance with various embodiments, the I/O transistor, when appropriately configured, may be characterized with at least one of: a relatively higher metal gate structure, a relatively higher source/drain structure, or a relatively thicker gate dielectric; and the core transistor, when appropriately configured, may be characterized with at least one of: a relatively shorter metal gate structure, a relatively shorter source/drain structure, or a relatively thinner gate dielectric, which will be discussed in further detail below.

Figure 4C:
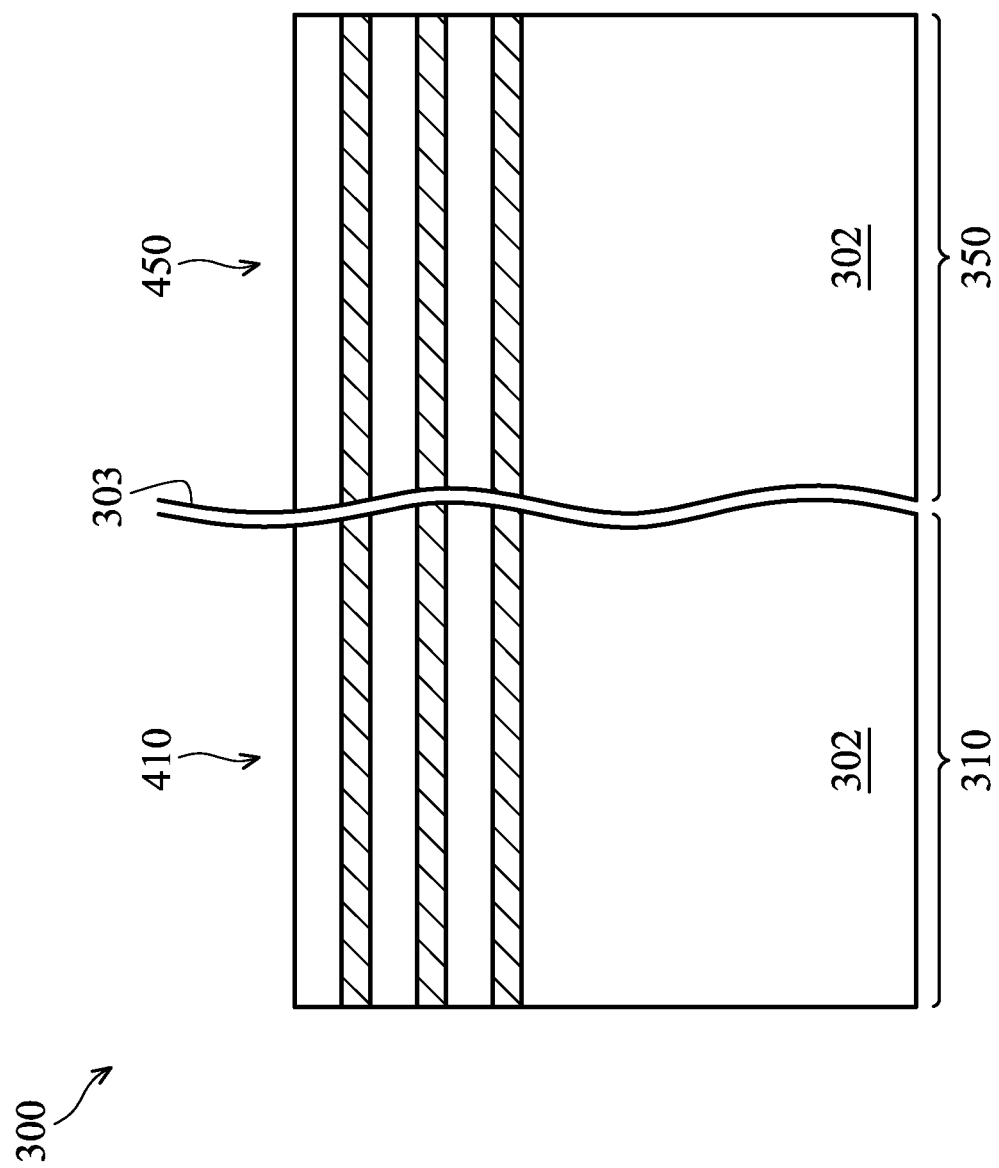

Corresponding to operation 204 of FIG. 2, FIG. 4A is a cross-sectional view of the GAA FET device 300 including a first fin structure 410 and a second fin structure 450 formed in the area 310 and area 350, respectively, at one of the various stages of fabrication. The cross-sectional view of FIG. 4A is cut in a direction along the lengthwise direction of an active/dummy gate structure of the GAA FET device 300 (e.g., cross-section A-A indicated in FIG. 1). Corresponding to the same operation, FIGS. 4B and 4C illustrate cross-sectional views of the GAA FET device 300 that are cut along cross-section B-B and cross-section C-C (as indicated in FIG. 1), respectively.

To form the fin structures 410 and 450, a number of first semiconductor layers 401 and a number of second semiconductor layers 402 are alternatingly disposed on top of one another to form a stack. For example, one of the second semiconductor layers 402 is disposed over one of the first semiconductor layers 401 then another one of the first semiconductor layers 401 is disposed over the second semiconductor layer 402, so on and so forth. The stack may include any number of alternately disposed first and second semiconductor layers 401 and 402. For example, in the illustrated embodiments of FIGS. 4A-C (and the following figures), the stack may include 3 first semiconductor layers 401, with 3 second semiconductor layers 402 alternatingly disposed therebetween and with one of the second semiconductor layers 402 being the topmost semiconductor layer. It should be understood that the GAA FET device 300 can include any number of first semiconductor layers and any number of second semiconductor layers, with either one of the first or second semiconductor layers being the topmost semiconductor layer, while remaining within the scope of the present disclosure.

The semiconductor layers 401 and 402 may have respective different thicknesses. Further, the first semiconductor layers 401 may have different thicknesses from one layer to another layer. The second semiconductor layers 402 may have different thicknesses from one layer to another layer. The thickness of each of the semiconductor layers 401 and 402 may range from few nanometers to few tens of nanometers. The first layer of the stack may be thicker than other semiconductor layers 401 and 402. In an embodiment, each of the first semiconductor layers 401 has a thickness ranging from about 5 nanometers (nm) to about 20 nm, and each of the second semiconductor layers 402 has a thickness ranging from about 5 nm to about 20 nm.

The two semiconductor layers 401 and 402 may have different compositions. In various embodiments, the two semiconductor layers 401 and 402 have compositions that provide for different oxidation rates and/or different etch selectivity between the layers. In an embodiment, the first semiconductor layers 401 may each include silicon germanium ($Si_{1-x}Ge_x$), and the second semiconductor layers may each include silicon (Si). In an embodiment, each of the semiconductor layers 402 is silicon that may be undoped or substantially dopant-free (i.e., having an extrinsic dopant concentration from about 0 $cm^{-3}$ to about $1 \times 10^{17}$ $cm^{-3}$), where for example, no intentional doping is performed when forming the layers 402 (e.g., of silicon).

In various embodiments, the semiconductor layers 402 may be intentionally doped. For example, when the GAA FET device 300 is configured as an n-type transistor (and operates in an enhancement mode), each of the semiconductor layers 402 may be silicon that is doped with a p-type dopant such as boron (B), aluminum (Al), indium (In), and gallium (Ga); and when the GAA FET device 300 is configured as a p-type transistor (and operates in an enhancement mode), each of the semiconductor layers 402 may be silicon that is doped with an n-type dopant such as phosphorus (P), arsenic (As), antimony (Sb). In another example, when the GAA FET device 300 is configured as an n-type transistor (and operates in a depletion mode), each of the semiconductor layers 402 may be silicon that is doped with an n-type dopant instead; and when the GAA FET device 300 is configured as a p-type transistor (and operates in a depletion mode), each of the semiconductor layers 402 may be silicon that is doped with a p-type dopant instead.

In some embodiments, each of the semiconductor layers 401 is $Si_{1-x}Ge_x$ that includes less than 50% (x<0.5) Ge in molar ratio. For example, Ge may comprise about 15% to 35% of the semiconductor layers 401 of $Si_{1-x}Ge_x$ in molar ratio. Furthermore, the first semiconductor layers 401 may include different compositions among them, and the second semiconductor layers 402 may include different compositions among them. Either of the semiconductor layers 401 and 402 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 401 and 402 may be chosen based on providing differing oxidation rates and/or etch selectivity.

The semiconductor layers 401 and 402 can be epitaxially grown from the semiconductor substrate 302. For example, each of the semiconductor layers 401 and 402 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 302 extends upwardly, resulting in the semiconductor layers 401 and 402 having the same crystal orientation with the semiconductor substrate 302.

Upon growing the semiconductor layers 401 and 402 on the semiconductor substrate 302 (as a stack), the stack may be patterned to form the fin structure 410 and the fin structure 450, as shown in FIGS. 4A-C. Each of the fin structures is elongated along a lateral direction, and includes a stack of patterned semiconductor layers 401-402 interleaved with each other. The fin structures 410 and 450 are formed by patterning the stack of semiconductor layers 401-402 and the semiconductor substrate 302 using, for example, photolithography and etching techniques.

For example, a mask layer (which can include multiple layers such as, for example, a pad oxide layer and an overlying hardmask layer) is formed over the topmost semiconductor layer of the stack (e.g., 402 in FIGS. 4A-C). The pad oxide layer may be a thin film comprising silicon oxide formed, for example, using a thermal oxidation process. The pad oxide layer may act as an adhesion layer between the topmost semiconductor layer 402 and the hardmask layer. In some embodiments, the hardmask layer may include silicon nitride, silicon oxynitride, silicon carbonitride, the like, or combinations thereof. In some other embodiments, the hardmask layer may include a material similar as a material of the semiconductor layers 401/402 such as, for example, $Si_{1-y}Ge_y$, Si, etc., in which the molar ratio (y) may be different from or similar to the molar ratio (x) of the semiconductor layers 401. The hardmask layer may be formed over the stack (i.e., before patterning the stack) using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

The patterned mask can be subsequently used to pattern exposed portions of the semiconductor layers 401-402 and the substrate 302 to form the fin structure 410 in the area 310 and the fin structure 450 in the area 350, respectively, thereby defining trenches (or openings) between adjacent fin structures. When multiple fin structures are formed, such a trench may be disposed between any adjacent ones of the fin structures. In some embodiments, the fin structures 410 and 450 are formed by etching trenches in the semiconductor layers 401-402 and substrate 302 using, for example, reactive ion etch (ME), neutral beam etch (NBE), the like, or combinations thereof. The etch may be anisotropic. In some embodiments, the trenches may be strips (when viewed from the top) parallel to each other, and closely spaced with respect to each other. In some embodiments, the trenches may be continuous and surround the respective fin structures.

Figure 5A:
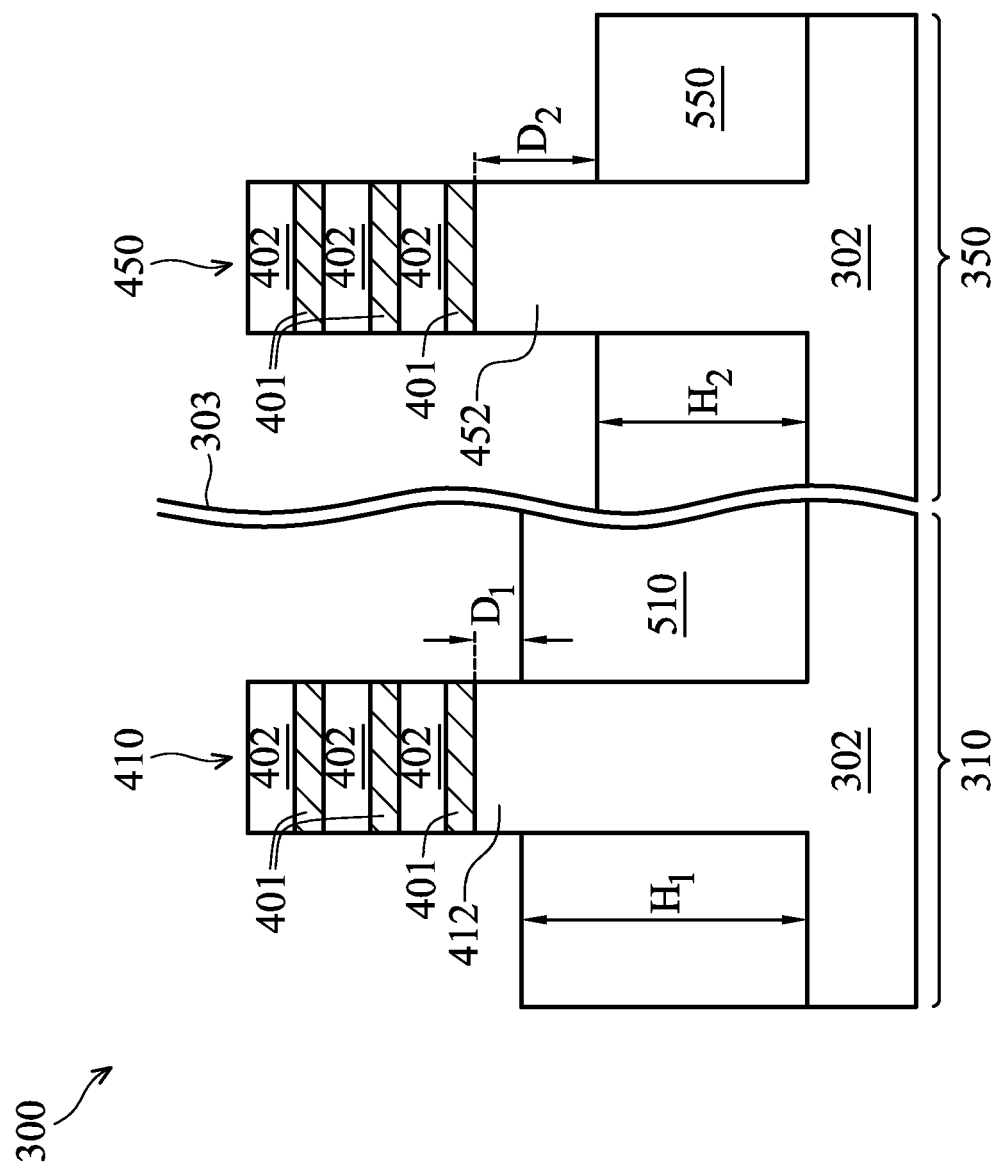

Corresponding to operation 206 of FIG. 2, FIG. 5A is a cross-sectional view of the GAA FET device 300 including one or more isolation structures 510 in the area 310 and one or more isolation structures 550 in the area 350, at one of the various stages of fabrication. The cross-sectional view of FIG. 5A is cut in a direction along the lengthwise direction of an active/dummy gate structure of the GAA FET device 300 (e.g., cross-section A-A indicated in FIG. 1). Corresponding to the same operation, FIGS. 5B and 5C illustrate cross-sectional views of the GAA FET device 300 that are cut along cross-section B-B and cross-section C-C (as indicated in FIG. 1), respectively.

To form the isolation structures 510 and 550, an insulation material may be universally deposited over the workpiece, which includes the fin structures 410 and 450. For example, the insulation material may overlay the fin structures 410 and 450 by extending along their respective sidewalls and overlaying their respective top surfaces. In some embodiments, the insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP) process, may remove any excess insulation material and form a top surface of the insulation material and a top surface of a patterned mask (not shown) defining the fin structures 410 and 450. The patterned mask may also be removed by the planarization process, in various embodiments.

Figure 5B:
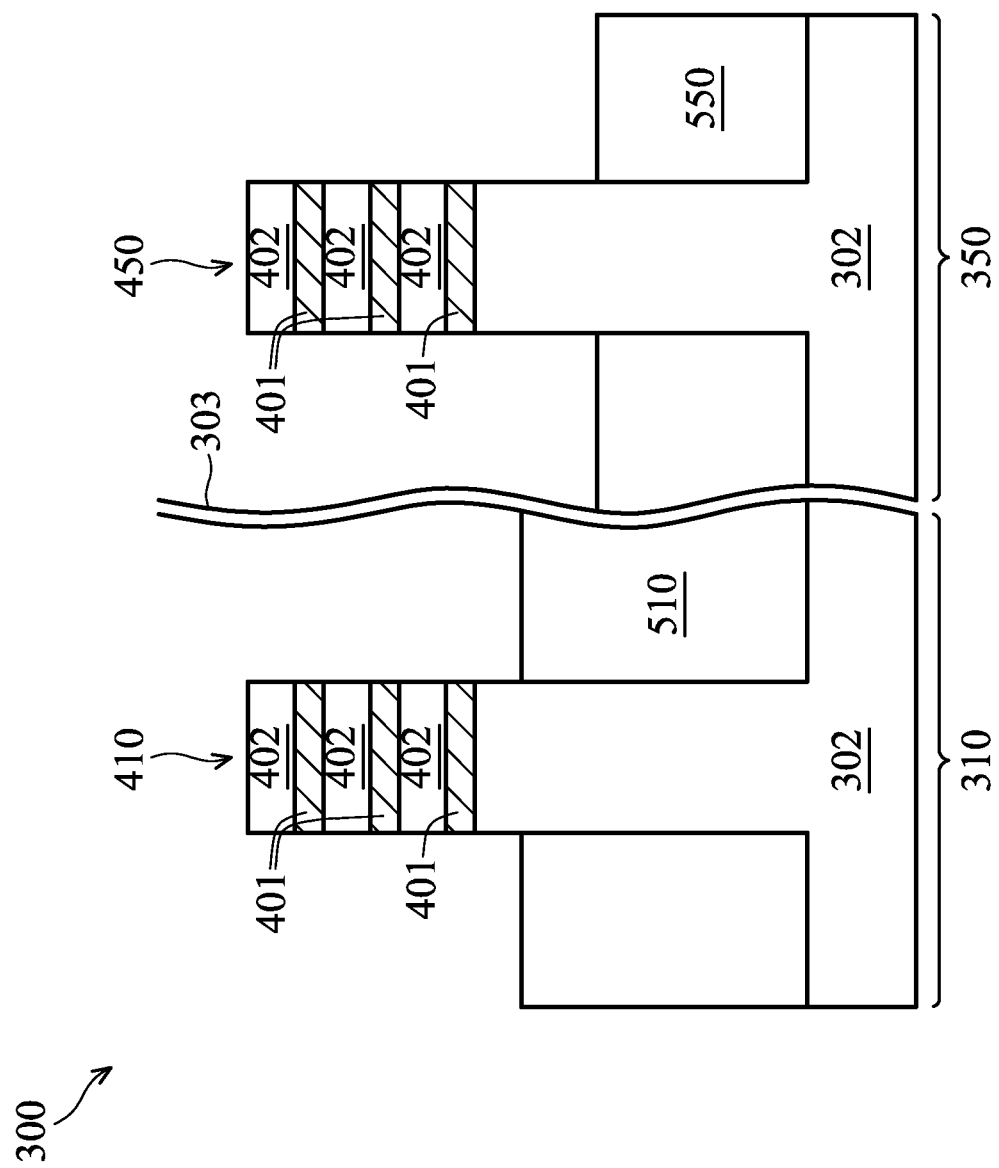
Figure 5C:
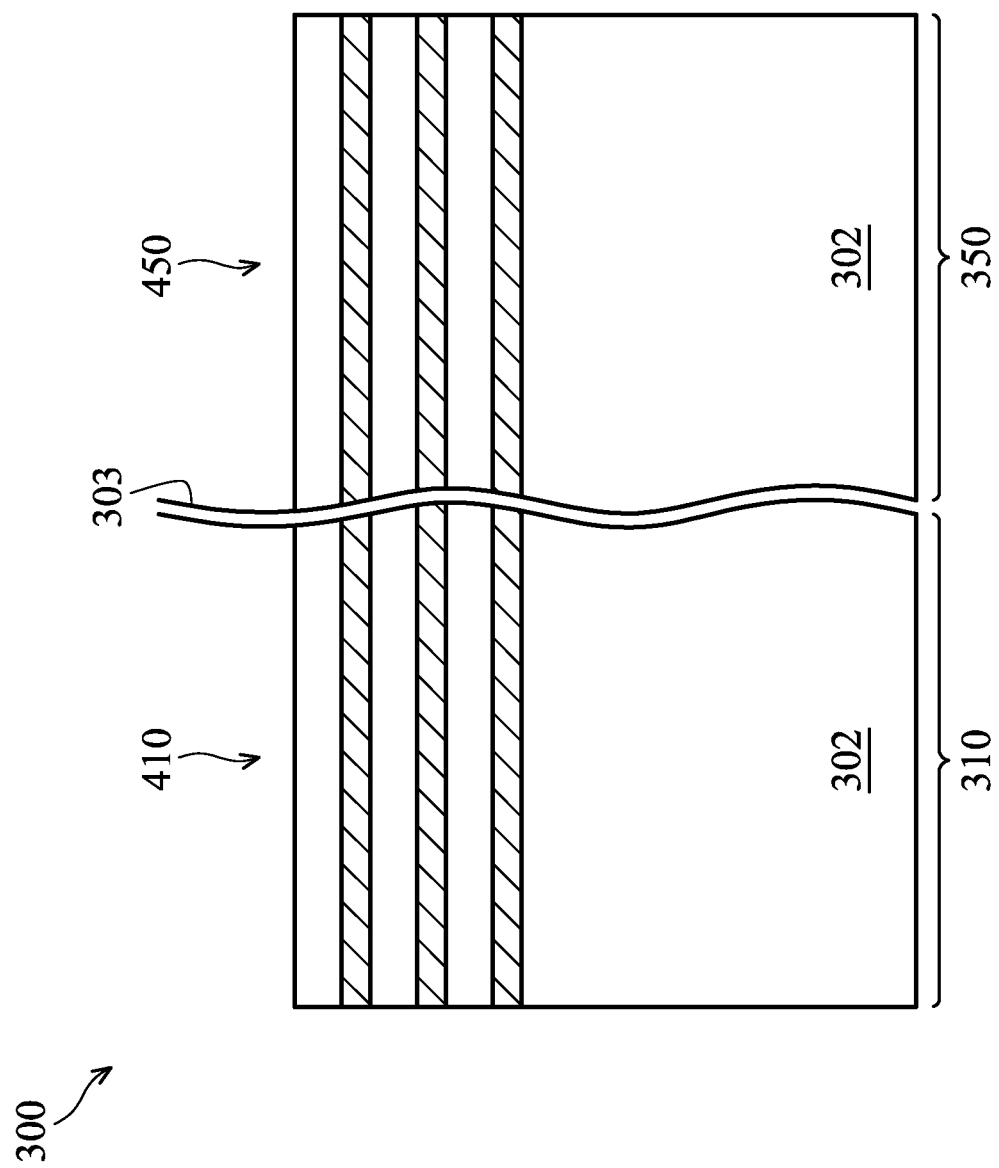

Next, the insulation material is recessed to form the isolation structure 510 in the area 310 and isolation structure 550 in the area 350, as shown in FIGS. 5A-B. The isolation structures 510 and 550 are sometimes referred to as shallow trench isolation (STI) 510 and 550, respectively. The isolation structures 510 and 550 are recessed such that the fin structure 410 and 450 protrude from between neighboring portions of the isolation structures 510 and 550. The top surface of the isolation structures (STIs) 510 and 550 may have a flat surface (as illustrated), a convex surface, a concave surface (such as dishing), or combinations thereof. The top surface of the isolation structures 510 and 550 may be formed flat, convex, and/or concave by an appropriate etch. The isolation structures 510 and 550 may be recessed using an acceptable etching process, such as one that is selective to the insulation material of the isolation structures 510 and 550. For example, a dry etch or a wet etch using dilute hydrofluoric (DHF) acid may be performed to form the isolation structures 510 and 550.

In various embodiments, the isolation structure 510 formed in the high density area 310 may be formed to have a taller height than the isolation structure 550 formed in the low density area 350. As shown in FIG. 5A, the isolation structure 510 has a height, $H_1$, measure from a top surface of the substrate 302 to a top surface of the isolation structure 510, and the isolation structure 550 has a height, $H_2$, measure from the top surface of the substrate 302 to a top surface of the isolation structure 550, wherein $H_1$ is greater than $H_2$. As such, the respective heights of a (substrate) protruding portion 412 of the fin structure 410 and a (substrate) protruding portion 452 of the fin structure 450, $D_1$ and $D_2$, are different. In some embodiments, the height $D_1$ is measured from the top surface of the isolation structure 510 to a bottom surface of the bottommost semiconductor layer of the fin structure 410 (e.g., 401), and the height $D_2$ is measured from the top surface of the isolation structure 550 to a bottom surface of the bottommost semiconductor layer of the fin structure 450 (e.g., 401). As a non-limiting example, $D_1$ and $D_2$ may each range between about 0.3 nanometers (nm) and about 100 nm.

Figure 6A:
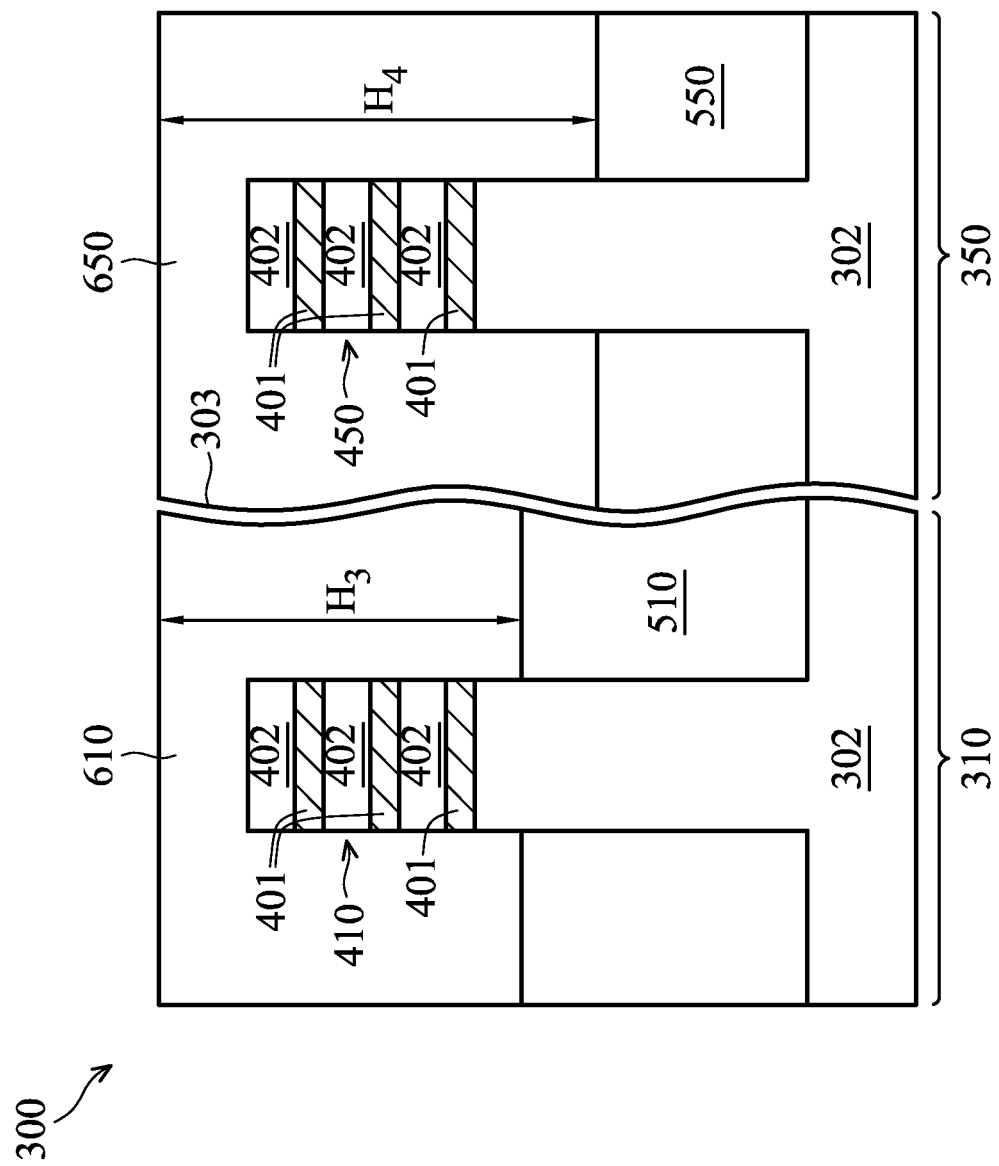
Figure 6B:
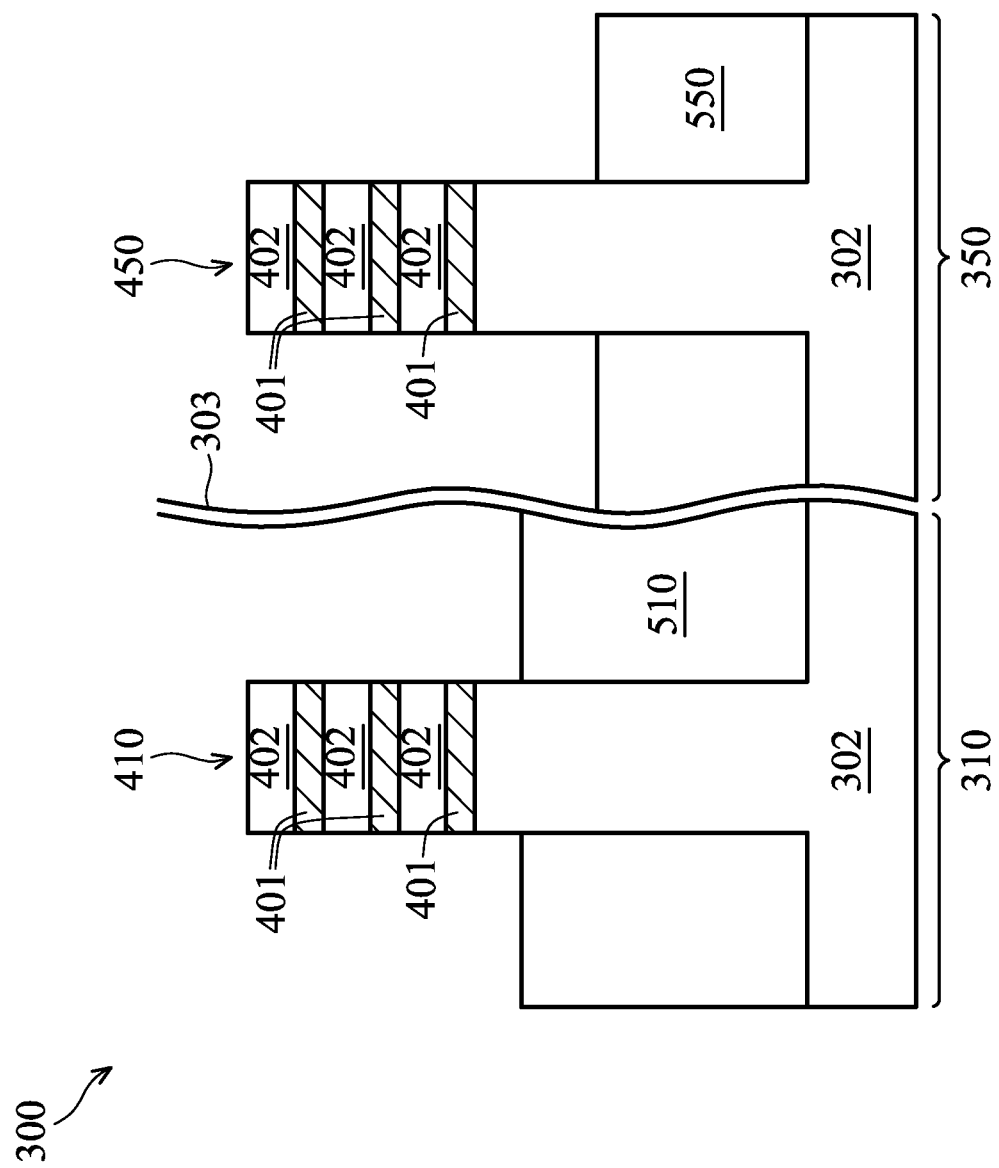
Figure 6C:
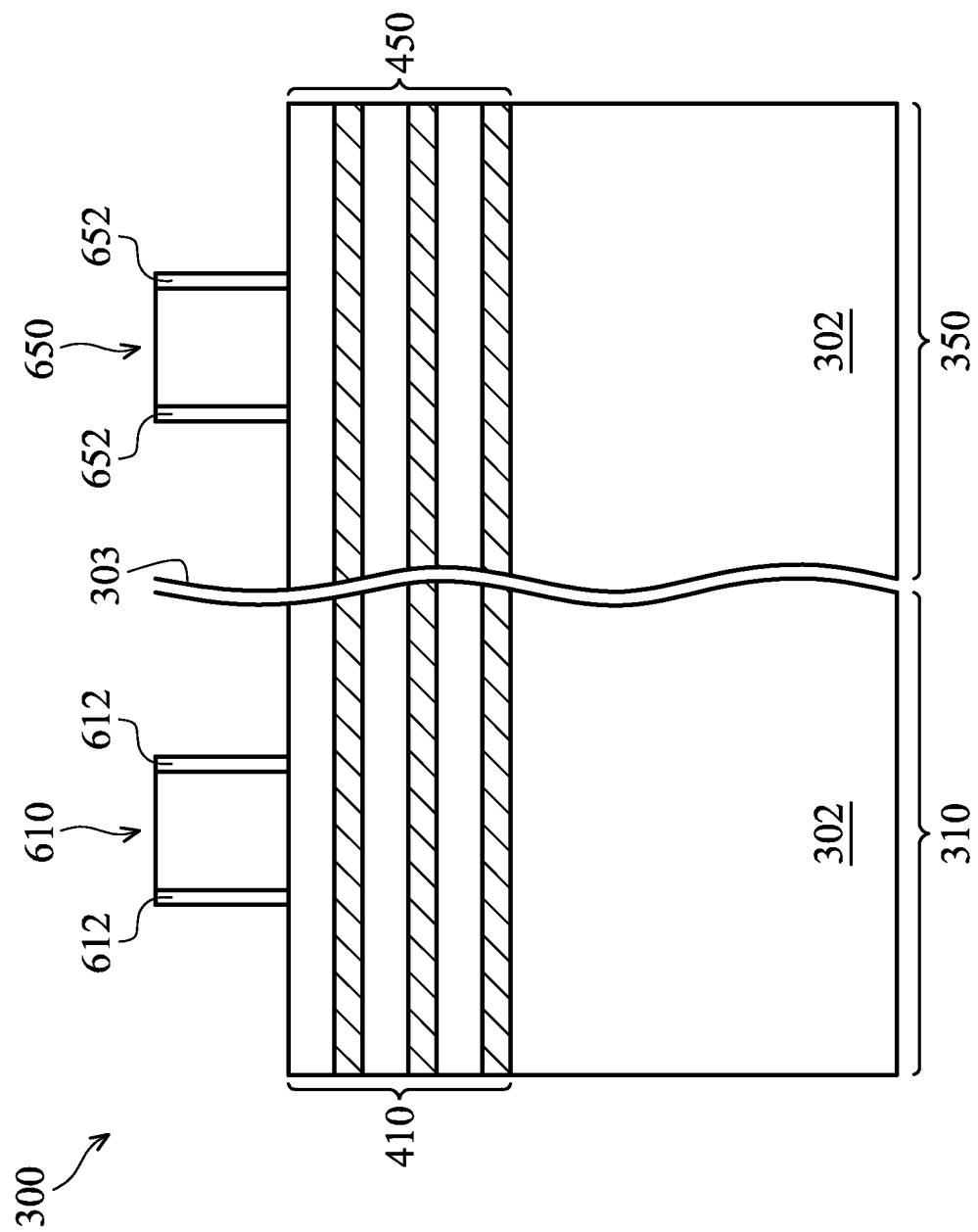

Corresponding to operation 208 of FIG. 2, FIG. 6A is a cross-sectional view of the GAA FET device 300 including a dummy gate structure 610 in the area 310 and a dummy gate structure 650 in the area 350, at one of the various stages of fabrication. The cross-sectional view of FIG. 6A is cut in a direction along the lengthwise direction of an active/dummy gate structure of the GAA FET device 300 (e.g., cross-section A-A indicated in FIG. 1). Corresponding to the same operation, FIGS. 6B and 6C illustrate cross-sectional views of the GAA FET device 300 that are cut along cross-section B-B and cross-section C-C (as indicated in FIG. 1), respectively.

The dummy gate structures 610 and 650 may have a lengthwise direction (e.g., along direction A-A in FIG. 1) perpendicular to the lengthwise direction of the fin structures (e.g., along direction C-C in FIG. 1). As such, the dummy gate structure 610 may be formed to overlay (e.g., straddle) a portion of the fin structure 410 in the area 310. Prior to, concurrently with, or subsequently to forming the dummy gate structure 610 in the area 310, a dummy gate structure 650 may be formed in the area 350 to overlay (e.g., straddle) a portion of the fin structure 450. For example, the dummy gate structures 610 and 650 may straddle central portions of the fin structures 410 and 450, respectively, such that respective end or side portions of the fin structures 410 and 450 are exposed, which can be better appreciated in the cross-sectional views of FIGS. 6A and 6B that are cut across the dummy gate structures and portions of the fin structures configured to form source/drain structures, respectively.

As shown in FIG. 6A, the dummy gate structure 610 may contact the top surface of the isolation structure 510 with its bottom surface, and the dummy gate structure 650 may contact the top surface of the isolation structure 550 with its bottom surface. Since the dummy gate structures 610 and 605 may be formed with a coplanar top surface and the isolation structures 510 and 550 are formed in different heights (in which the isolation structure 510 is formed higher than the isolation structure 550), the bottom surface of the dummy gate structure 610 may be "elevated" from the bottom surface of the dummy gate structure 650. Alternatively stated, a height of the dummy gate structure 610 ($H_3$) may be less than a height of the dummy gate structure 650 ($H_4$).

The dummy gate structures 610 and 650 may each include a dummy gate dielectric and a dummy gate, which are not shown separately for purpose of clarity. To form the dummy gate structures 610 and 650, a dielectric layer may be formed over the fin structures 410 and 450, respectively. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques. Next, the pattern of the mask layer may be transferred to the gate layer and the dielectric layer by a suitable etching technique to form the dummy gate structures 610 and 650, respectively.

Upon forming the dummy gate structures 610 and 650, a gate spacer 612 may be formed on opposing sidewalls of the dummy gate structure 610, and a gate spacer 652 may be formed on opposing sidewalls of the dummy gate structure 650, as shown in FIG. 6C. The gate spacers 612 and 652 may each be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacers 612 and 652. The shapes and formation methods of the gate spacers 612 and 652, as illustrated in FIG. 6C, are merely non-limiting examples, and other shapes and formation methods are possible. These and other variations are fully intended to be included within the scope of the present disclosure.

Figure 7A:
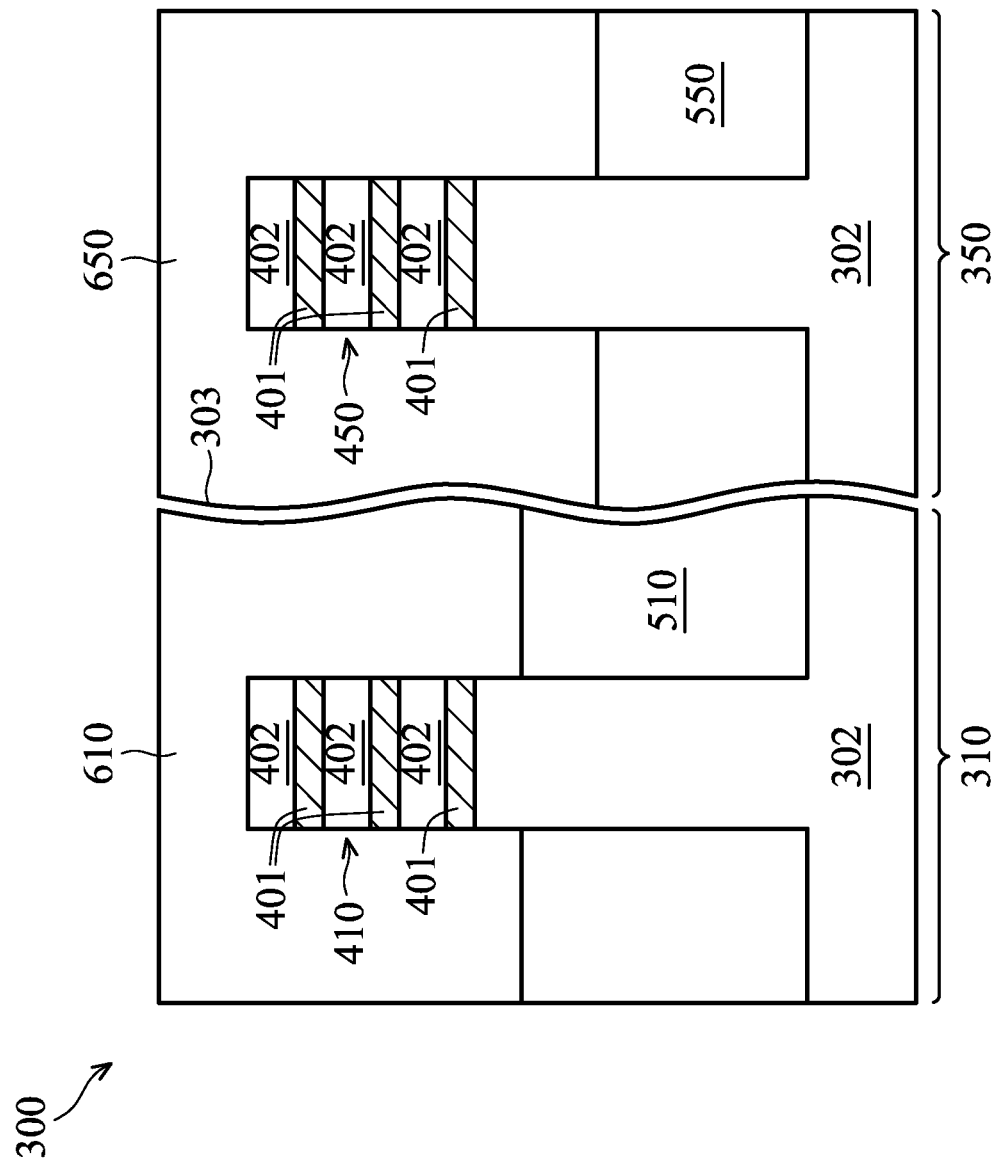

Corresponding to operation 210 of FIG. 2, FIG. 7A is a cross-sectional view of the GAA FET device 300 in which (e.g., end) portions of the fin structure 410 in the area 310 that are not overlaid by the dummy gate structure 610 and (e.g., end) portions of the fin structure 450 in the area 350 that are not overlaid by the dummy gate structure 650 are removed, at one of the various stages of fabrication. The cross-sectional view of FIG. 7A is cut in a direction along the lengthwise direction of an active/dummy gate structure of the GAA FET device 300 (e.g., cross-section A-A indicated in FIG. 1). Corresponding to the same operation, FIGS. 7B and 7C illustrate cross-sectional views of the GAA FET device 300 that are cut along cross-section B-B and cross-section C-C (as indicated in FIG. 1), respectively.

Figure 7B:
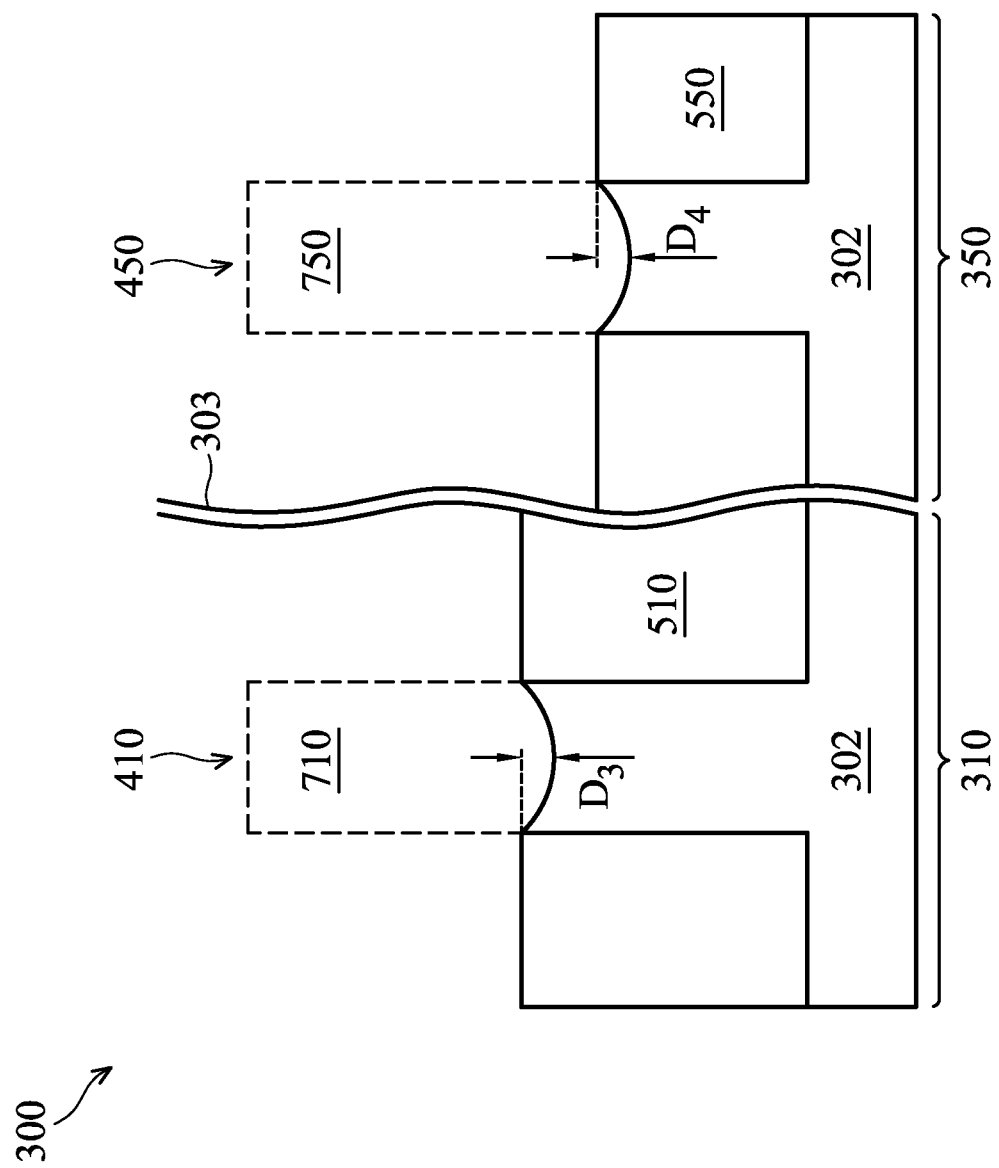
Figure 7C:
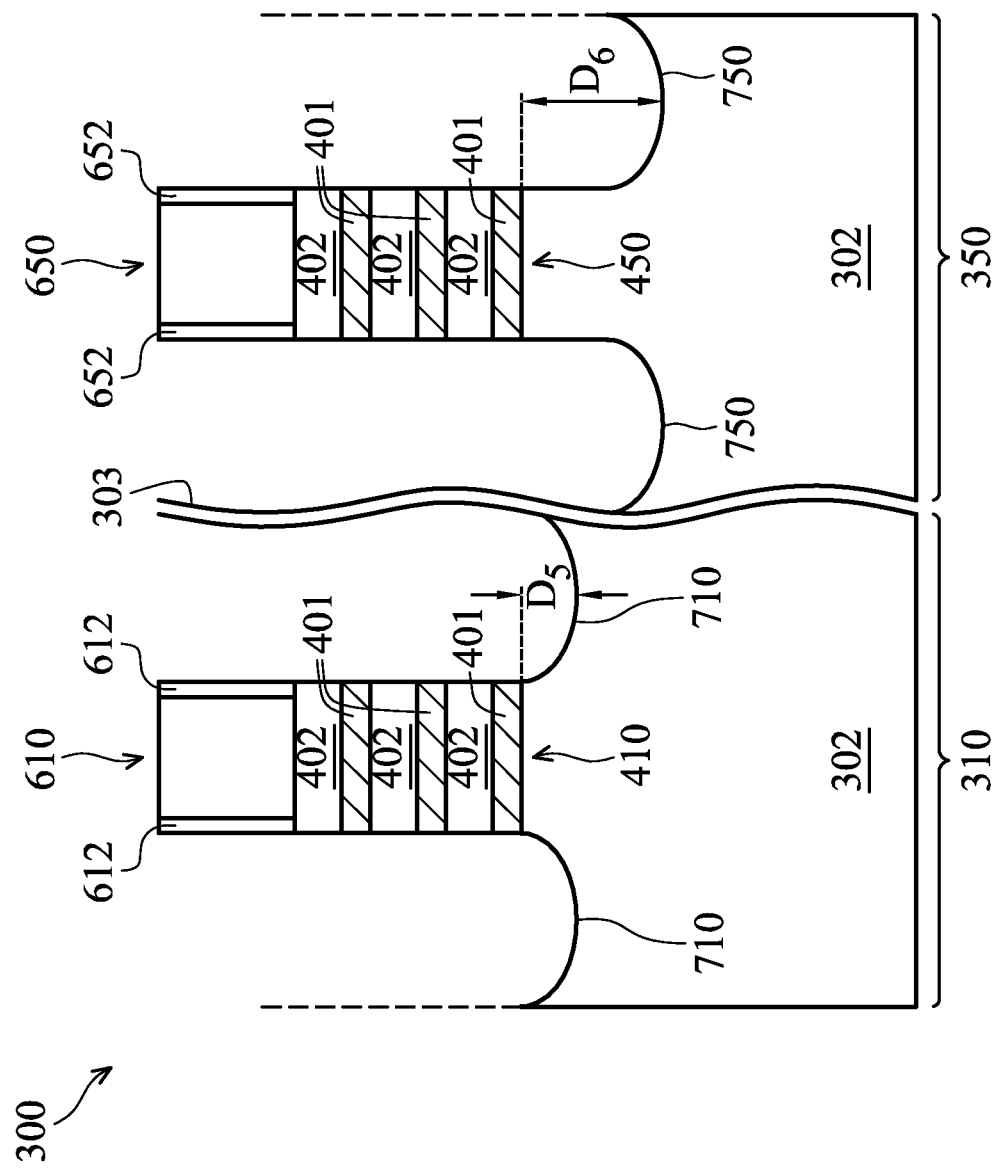

As shown in FIGS. 7B-C, the dummy gate structure 610 (together with the gate spacer 612) can serve as a mask to recess (e.g., etch) the non-overlaid portions of the fin structure 410, which results in the remaining fin structure 410 having respective remaining portions of the semiconductor layers 401 and 402 alternately stacked on top of one another; and the dummy gate structure 650 (together with the gate spacer 652) can serve as a mask to recess (e.g., etch) the non-overlaid portions of the fin structure 450, which results in the remaining fin structure 450 having respective remaining portions of the semiconductor layers 401 and 402 alternately stacked on top of one another. As a result, recesses 710 can be formed on opposite sides of the remaining fin structure 410; and recesses 750 can be formed on opposite sides of the remaining fin structure 450.

In various embodiments, a depth, $D_3$, with which the recess 710 extends into the substrate 302 is shallower than a depth, $D_4$, with which the recess 750 extends into the substrate 302, which can be better appreciated in FIG. 7B. The depths $D_3/D_4$ can be measured from a bottommost point of the recesses 710/750 to the top surface of the isolation structure 510/550, in some embodiments. As a non-limiting example, $D_3$ and $D_4$ may each range between about 0.3 nanometers (nm) and about 100 nm. Cut along another cross-section in FIG. 7C, the recesses 710 and 750 extend into the substrate 302 with depths, $D_5$ and $D_6$, respectively. The depths $D_5/D_6$ can be measured from a bottommost point of the recesses 710/750 to a bottom surface of the semiconductor layer 401 of the fin structure 410/450, in some embodiments. As a non-limiting example, $D_5$ and $D_6$ may each range between about 0.3 nanometers (nm) and about 100 nm.

The recessing step to form the recesses 710/750 may be configured to have at least some anisotropic etching characteristic. For example, the recessing step can include a plasma etching process, which can have a certain amount of anisotropic characteristic. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the recessing step, the gas sources and/or the passivation gases can be diluted with gases such as argon (Ar), helium (He), neon (Ne), and other suitable dilutive gases and combinations thereof to control the above-described etching rates.

The difference of recessed depths (which may range between about 1 nm and about 50 nm) can be achieved by applying a greater etching amount (e.g., a longer etching time, a higher source and/or bias power, etc.) on the fin structure 450 than on the fin structure 410. For example, the fin structure 410 may be masked while applying the etching amount on the fin structure 450, and the fin structure 450 may be masked while applying the etching amount on the fin structure 410. Further, in order to control the difference of recessed depths not to exceed a certain threshold (e.g., about 50 nm), the above-described passivation gases may be applied more when forming the recesses 750 in the low density area 350 than forming the recesses 710 in the high density area 310, according to certain embodiments.

Figure 8A:
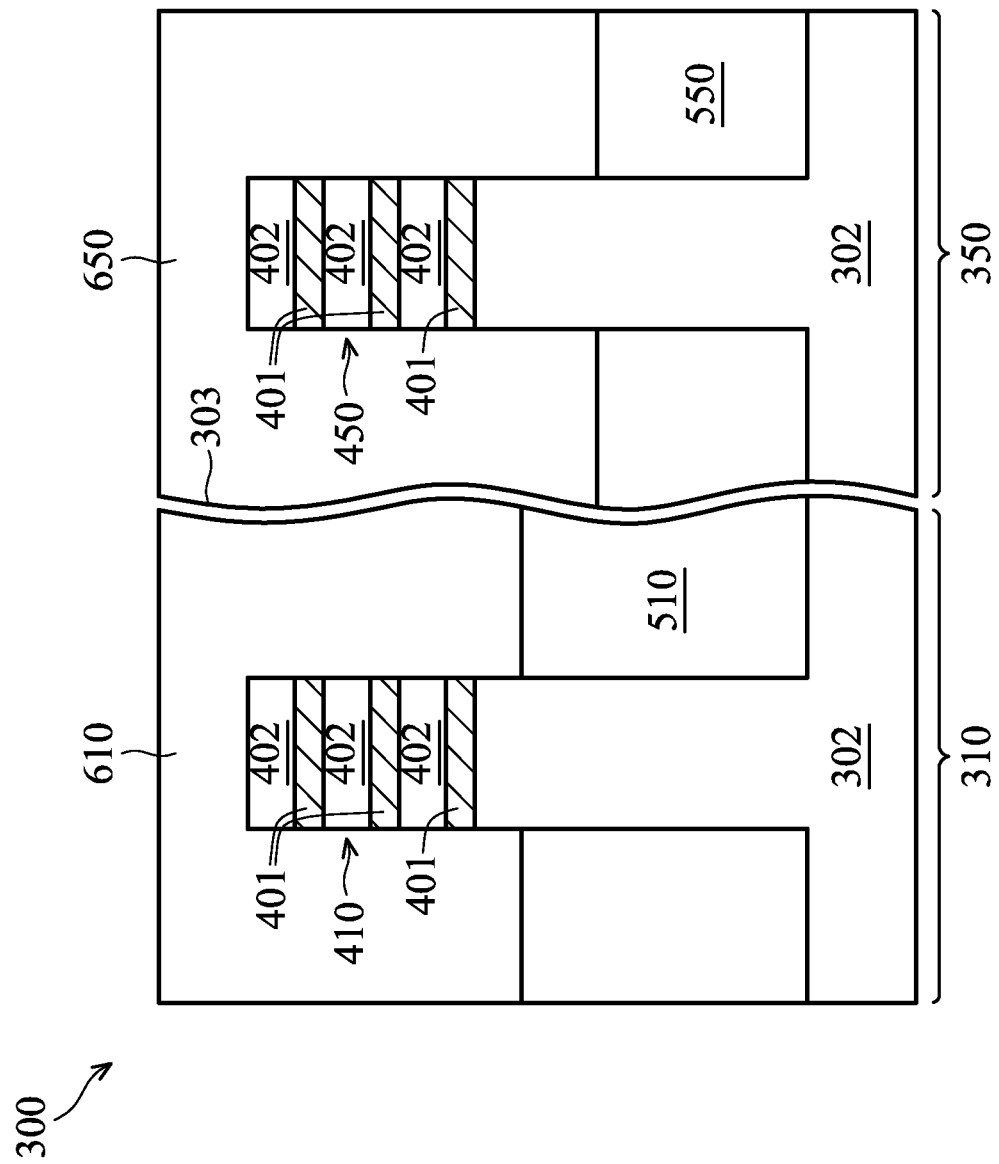

Corresponding to operation 212 of FIG. 2, FIG. 8A is a cross-sectional view of the GAA FET device 300 including source/drain structures 810 in the area 310 and source/drain structures 850 in the area 350, at one of the various stages of fabrication. The cross-sectional view of FIG. 8A is cut in a direction along the lengthwise direction of an active/dummy gate structure of the GAA FET device 300 (e.g., cross-section A-A indicated in FIG. 1). Corresponding to the same operation, FIGS. 8B and 8C illustrate cross-sectional views of the GAA FET device 300 that are cut along cross-section B-B and cross-section C-C (as indicated in FIG. 1), respectively.

Figure 8B:
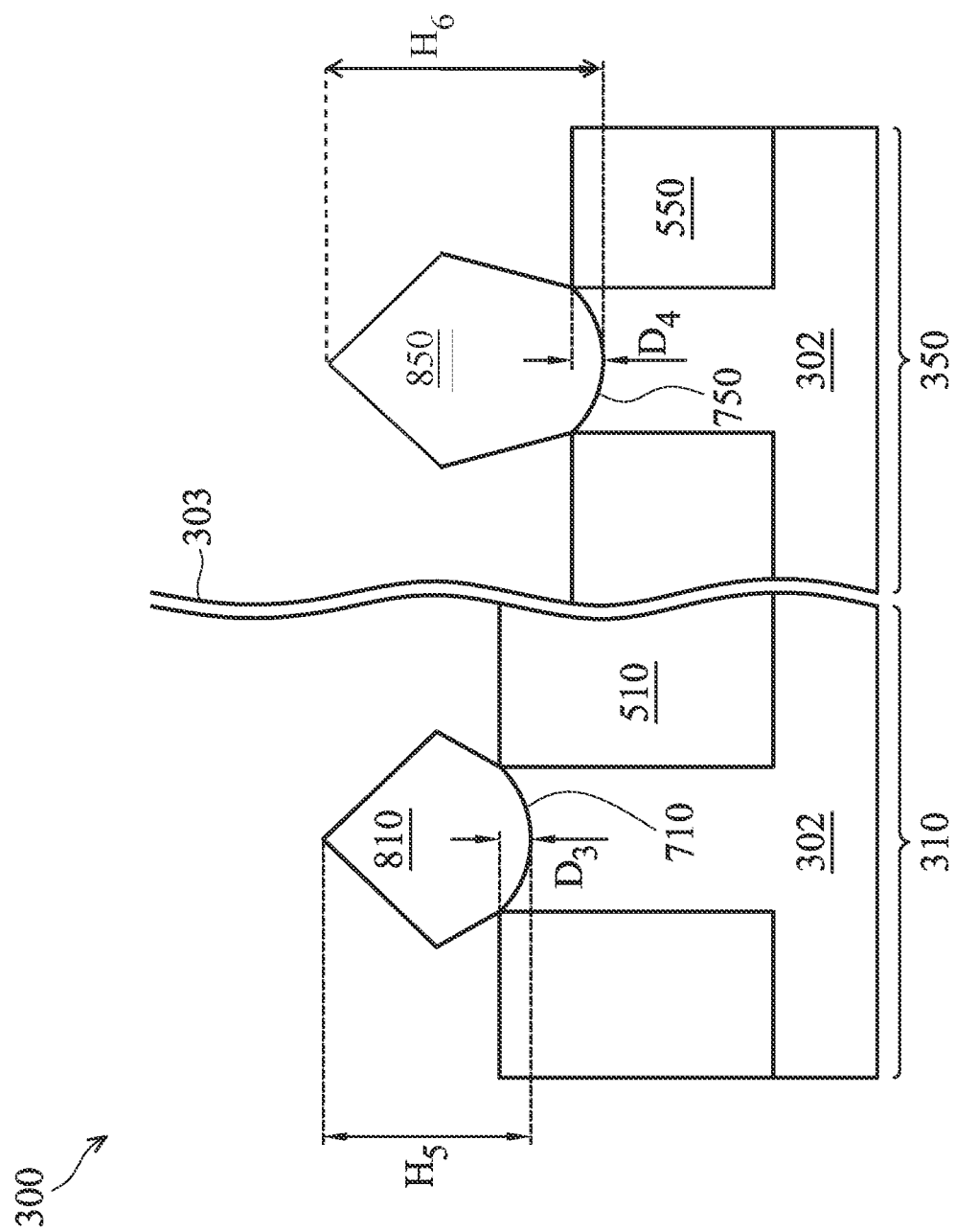
Figure 8C:
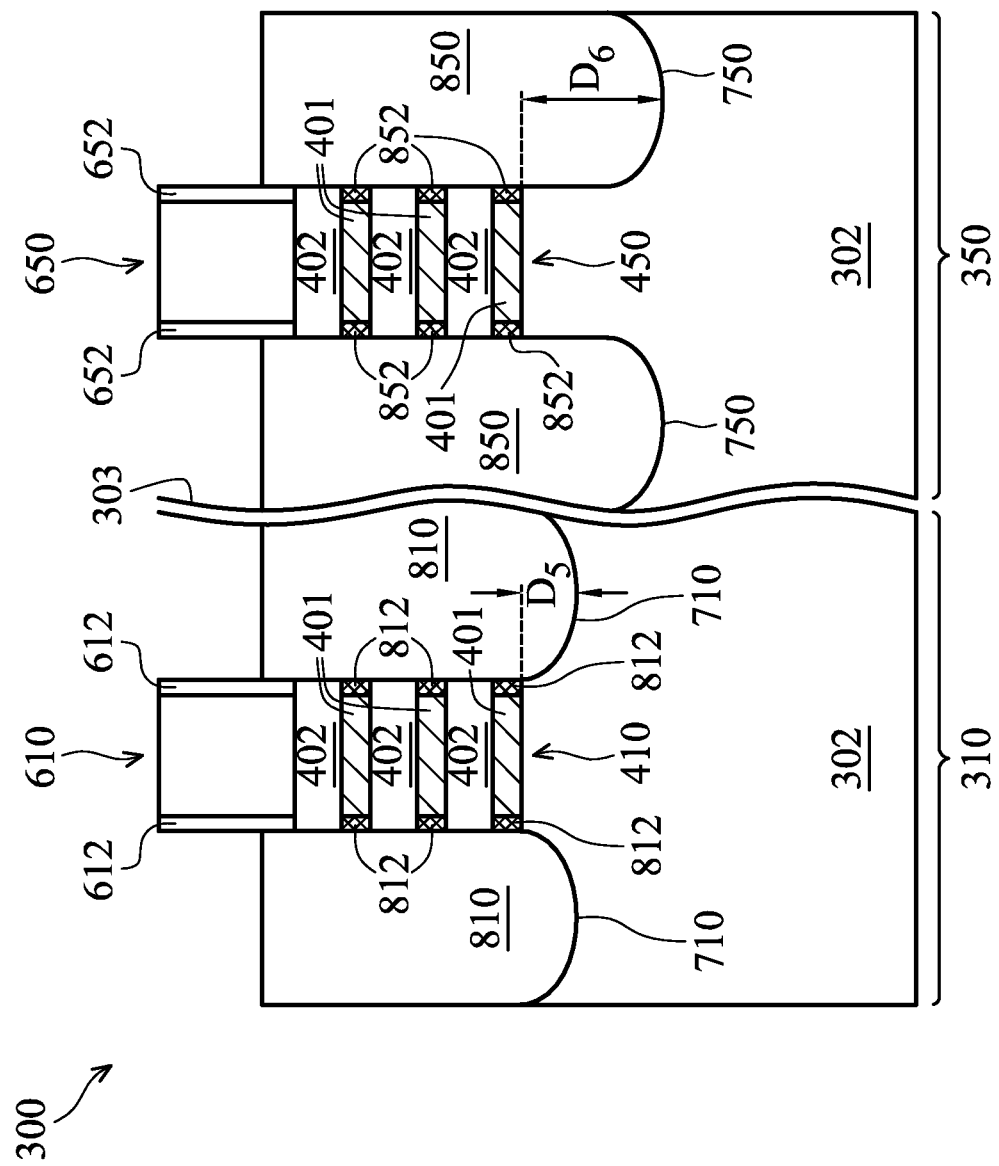

As shown in FIGS. 8B-C, the source/drain structures 810 are disposed in the recess 710 and protrudes from the top surface of the isolation structure 510; and the source/drain structures 850 are disposed in the recess 750 and protrudes from the top surface of the isolation structure 550. As such, (a lower portion of) the source/drain structure 810 can inherit the dimensions and profiles of the recess 710 (e.g., extending into the substrate 302 with the depth $D_3/D_5$); and (a lower portion of) the source/drain structure 850 can inherit the dimensions and profiles of the recess 750 (e.g., extending into the substrate 302 with the depth $D_4/D_6$). The source/drain structures 810 and 850 are formed by epitaxially growing a semiconductor material in the recesses 710 and 750, respectively, using suitable methods such as metal-organic CVD (MOCVD), molecular beam epitaxy (MBE), liquid phase epitaxy (LPE), vapor phase epitaxy (VPE), selective epitaxial growth (SEG), the like, or combinations thereof.

Prior to forming the source/drain structures 810 and 850, end portions of the semiconductor layers can be removed (e.g., etched) using a "pull-back" process to pull the semiconductor layers 401 of the fin structures 410 and 450 back by a pull-back distance. In an example where the semiconductor layers 402 include Si, and the semiconductor layers 401 include SiGe, the pull-back process may include a hydrogen chloride (HCl) gas isotropic etch process, which etches SiGe without attacking Si. As such, the Si layers (nanostructures) 402 may remain intact during this process. Consequently, a pair of recesses can be formed on the ends of each semiconductor layer 401, with respect to the neighboring semiconductor layers 402. Next, such recesses along the ends of each semiconductor layer 401 can be filled with a dielectric material to form inner spacers 812 and 852, as shown in FIG. 8C. The dielectric material for the inner spacers may include silicon nitride, silicoboron carbonitride, silicon carbonitride, silicon carbon oxynitride, or any other type of dielectric material (e.g., a dielectric material having a dielectric constant k of less than about 5) appropriate to the role of forming an insulating gate sidewall spacers of transistors.

As further shown in FIG. 8C, the source/drain structures 810 are disposed on the opposite sides of the fin structure 410 to couple to the semiconductor layers 402 of the fin structure 410, and separate from the semiconductor layers 401 of the fin structure 410 with the inner spacer 812 disposed therebetween; and the source/drain structures 850 are disposed on the opposite sides of the fin structure 450 to couple to the semiconductor layers 402 of the fin structure 450, and separate from the semiconductor layers 401 of the fin structure 450 with the inner spacer 852 disposed therebetween. Further, the source/drain structures 810 are separated from the dummy gate structure 610, with (at least a lower portion of) the gate spacer 612; and the source/drain structures 850 are separated from the dummy gate structure 650, with (at least a lower portion of) the gate spacer 652.

According to various embodiments of the present disclosure, the semiconductor layers 402 in each of the fin structures may collectively function as the conductive channel of a completed transistor. Accordingly, the semiconductor layers 402 may hereinafter be referred to as channel layers. The (remaining) semiconductor layers 401 in each of the fin structures may be later replaced with a portion of an active gate structure that is configured to wrap around the corresponding channel layers. Accordingly, the semiconductor layers 401 may hereinafter be referred to as sacrificial layers.

By recessing the substrate 302 more in the low density area 350 than the high density area 310, the source/drain structures 850 in the area 350 can be formed in a height ($H_6$) greater than a height ($H_5$) of the source/drain structures 810 in the area 310, as shown in FIG. 8B. With such source/drain structures in greater dimensions coupled to the channel layers 402 of the fin structure 450 (FIG. 8C), the transistor that adopts the source/drain structures 850 can have a higher level of driving current than the transistor that adopts the source/drain structures 810. However, in order to control (e.g., turn off) such high driving current, the transistor in the area 350 is formed to have an active gate structure in greater dimensions, which will be discussed in further detail below.

Figure 9A:
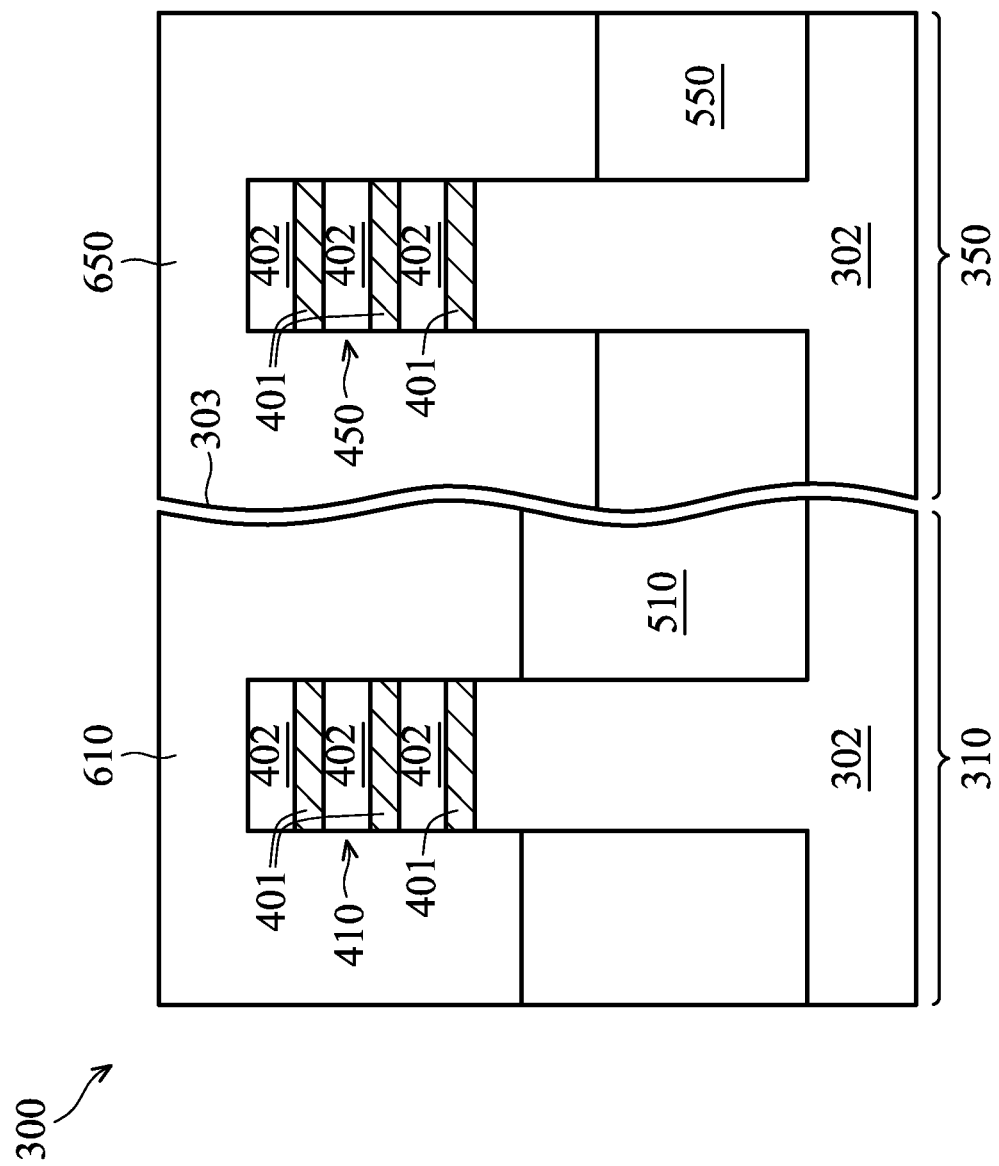
Figure 9B:
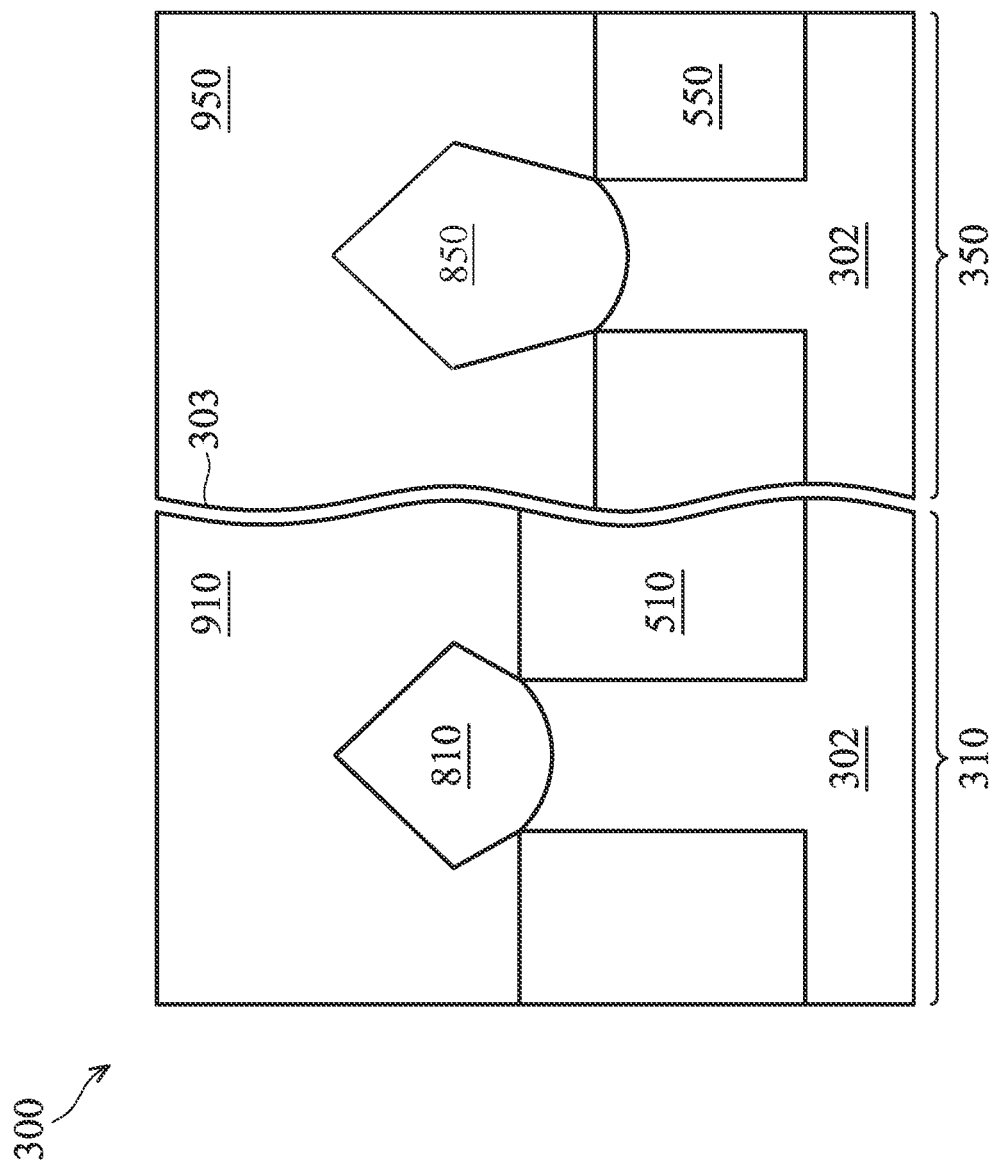
Figure 9C:
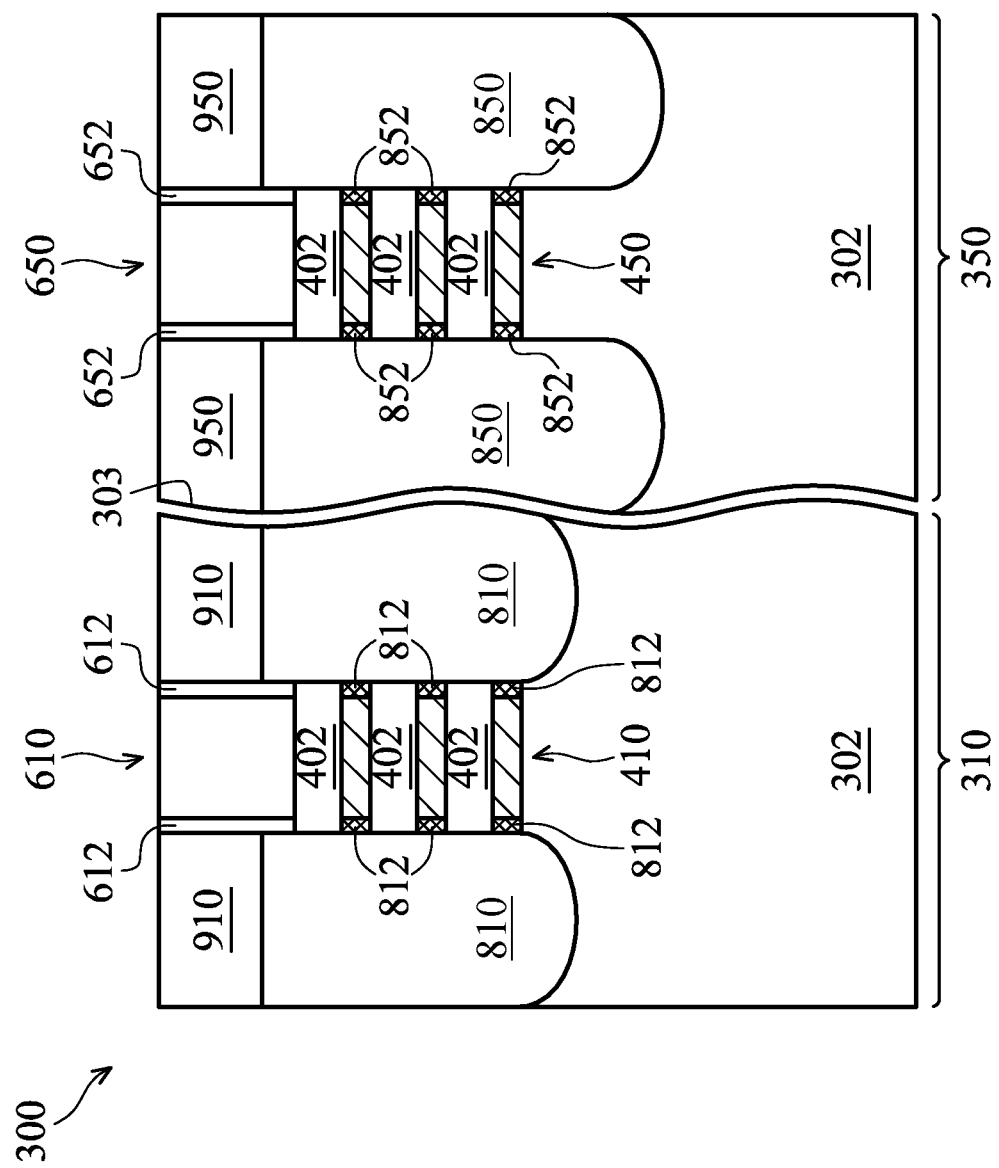

Corresponding to operation 214 of FIG. 2, FIG. 9A is a cross-sectional view of the GAA FET device 300 including an interlayer dielectric (ILD) 910 in the area 310 and an ILD 950 in the area 350, at one of the various stages of fabrication. The cross-sectional view of FIG. 9A is cut in a direction along the lengthwise direction of an active/dummy gate structure of the GAA FET device 300 (e.g., cross-section A-A indicated in FIG. 1). Corresponding to the same operation, FIGS. 9B and 9C illustrate cross-sectional views of the GAA FET device 300 that are cut along cross-section B-B and cross-section C-C (as indicated in FIG. 1), respectively.

In some embodiments, the ILDs 910 and 950 may be concurrently formed to respectively overlay the source/drain structures 810 in the area 310 and the source/drain structures 850 in the area 350. The ILD 910/950 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD is formed, an optional dielectric layer (not shown) is formed over the ILD. The dielectric layer can function as a protection layer to prevent or reduces the loss of the ILD in subsequent etching processes. The dielectric layer may be formed of a suitable material, such as silicon nitride, silicon carbonitride, or the like, using a suitable method such as CVD, PECVD, or FCVD. After the dielectric layer is formed, a planarization process, such as a CMP process, may be performed to achieve a level top surface for the dielectric layer. After the planarization process, the top surface of the dielectric layer is level with the top surface of the dummy gate structures 610 and 650, in some embodiments.

Figure 10A:
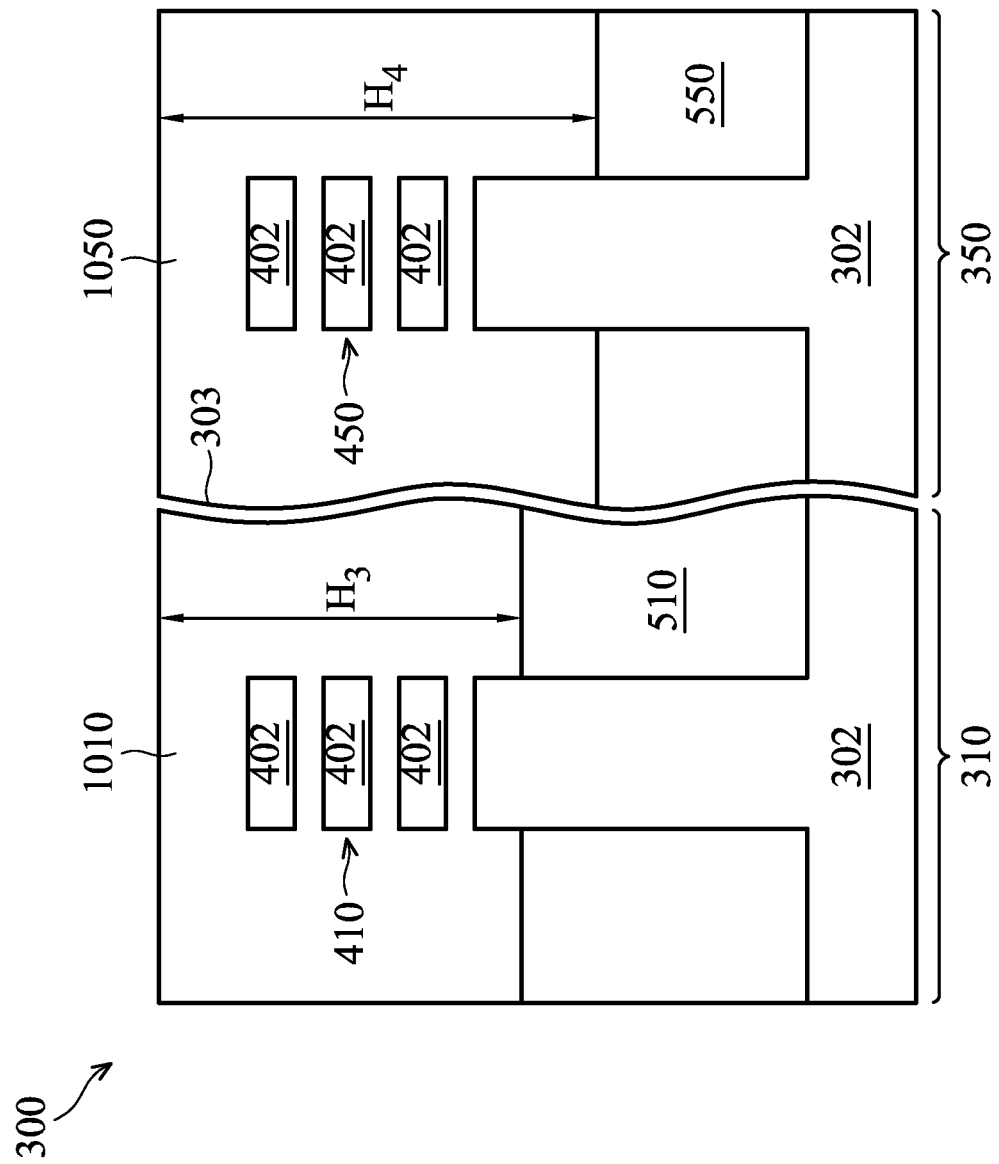
Figure 10B:
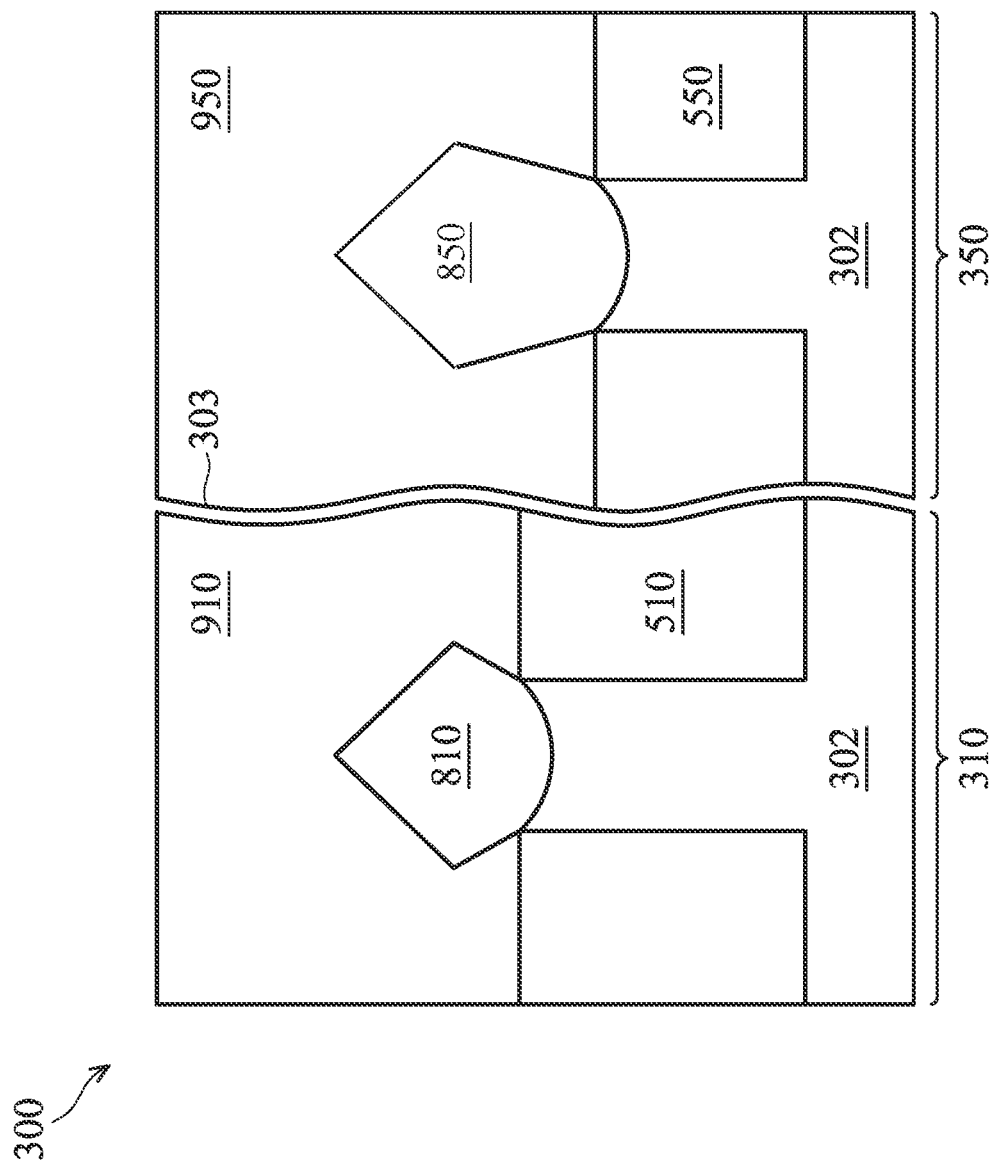
Figure 10C:
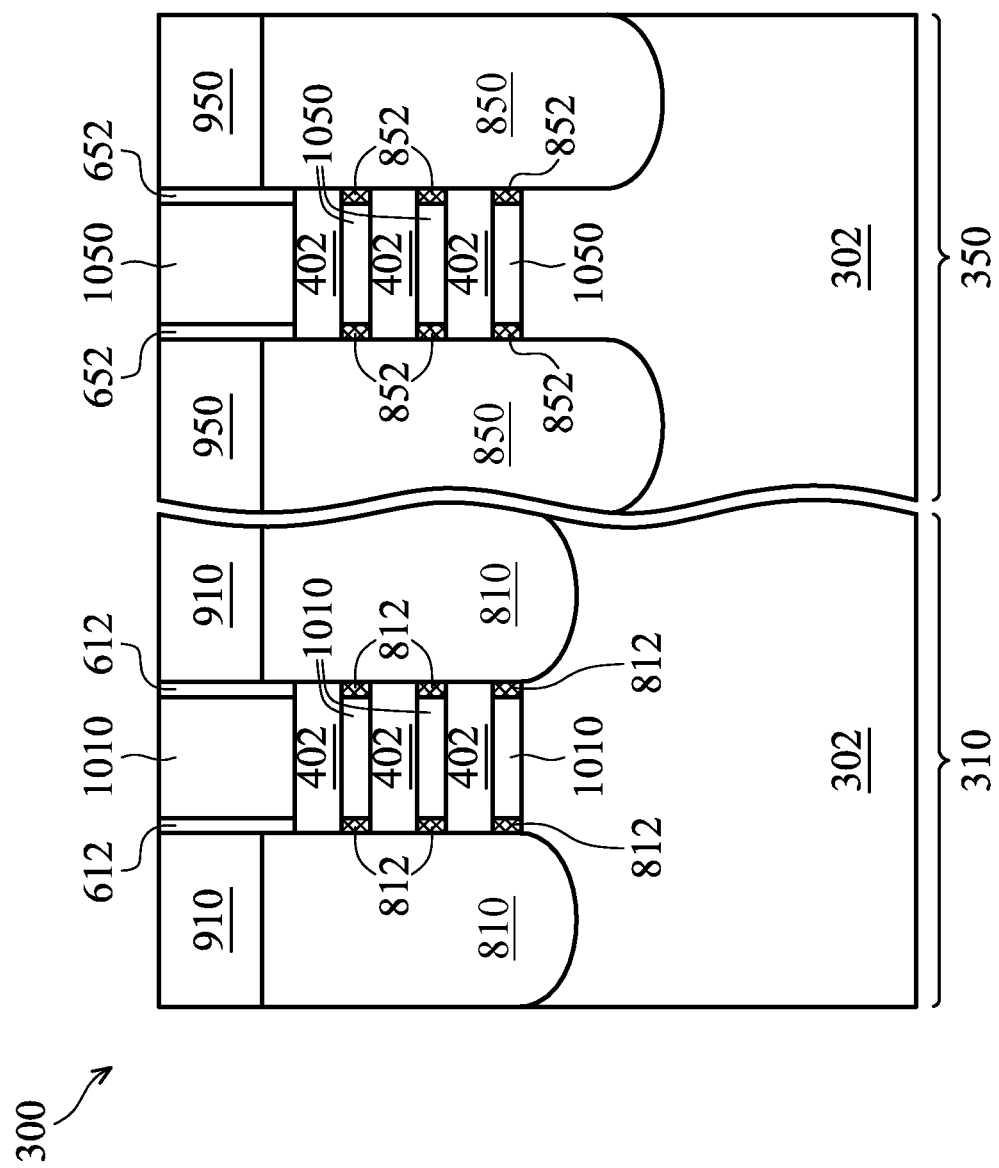

Corresponding to operation 216 of FIG. 2, FIG. 10A is a cross-sectional view of the GAA FET device 300 including an active (e.g., metal) gate structure 1010 in the area 310 and an active (e.g., metal) gate structure 1050 in the area 350, at one of the various stages of fabrication. The cross-sectional view of FIG. 10A is cut in a direction along the lengthwise direction of an active/dummy gate structure of the GAA FET device 300 (e.g., cross-section A-A indicated in FIG. 1). Corresponding to the same operation, FIGS. 10B and 10C illustrate cross-sectional views of the GAA FET device 300 that are cut along ross-section B-B and cross-section C-C (as indicated in FIG. 1), respectively.

Subsequently to forming the ILDs 910 and 950, the dummy gate structures 610 and 650 and the (remaining) sacrificial layers 401 may be concurrently removed. In various embodiments, the dummy gate structures 610 and 650 and the sacrificial layers 401 can be removed by applying a selective etch (e.g., a hydrochloric acid (HCl)), while leaving the channel layers 402 substantially intact. After the removal of the dummy gate structures 610 and 650, a gate trench, exposing respective sidewalls of each of the channel layers 402 may be formed. After the removal of the sacrificial layers 401 to further extend the gate trench, respective bottom surface and/or top surface of each of the channel layers 402 may be exposed. Consequently, a full circumference of each of the channel layers 402 can be exposed. Next, the active gate structure 1010 is formed to wrap around each of the channel layers 402 of the fin (or stack) structure 410; and the active gate structure 1050 is formed to wrap around each of the channel layers 402 of the fin (or stack) structure 450.

The active gate structures 1010 and 1050 each include a gate dielectric and a gate metal, in some embodiments. The gate dielectric can wrap around each of the channel layers 402, e.g., the top and bottom surfaces and sidewalls). The gate dielectric may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric may include a stack of multiple high-k dielectric materials. The gate dielectric can be deposited using any suitable method, including, for example, molecular beam deposition (MBD), atomic layer deposition (ALD), PECVD, and the like. In some embodiments, the gate dielectric may optionally include a substantially thin oxide (e.g., $SiO_x$) layer, which may be a native oxide layer formed on the surface of each of the channel layers 402.

The gate metal may include a stack of multiple metal materials. For example, the gate metal may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process.

Upon forming the active gate structures 1010 and 1050, a number of transistors can be defined (or otherwise formed) in the area 310 and area 350, respectively. For example, a first transistor that adopt the active gate structure 1010, source/drain structures 810 as its gate, drain, source, respectively, can be formed in the area 310; and a second transistor that adopt the active gate structure 1050, source/drain structures 850 as its gate, drain, source, respectively, can be formed in the area 350. In some embodiments, the first transistor may sometimes be referred to as a core transistor, and the second transistor may sometimes be referred to as an I/O transistor. As mentioned above, the I/O transistor is formed to have its source/drain structures in greater dimensions than the core transistor, which allows the I/O transistor to conduct a higher level of driving current. While being able to conduct such a higher level of current, the I/O transistor is also formed to have an active gate structure in greater dimensions (e.g., a greater height) than the core transistor to control the higher current. As shown in FIG. 10A, the active gate structures 1010 and 1050 can inherit the dimensions and profiles of the dummy gate structures such that the active gate structures 1010 and 1050 can have heights, $H_3$ and $H_4$, respectively.

In one aspect of the present disclosure, a semiconductor device is disclosed. The semiconductor device includes a substrate including a first area and a second area. The semiconductor device in the first area comprises: a first isolation structure; a plurality of first channel layers that are formed over the first isolation structure and extend along a first direction; and a first gate structure that wraps around each of the plurality of first channel layers and extends along a second direction perpendicular to the first direction. The first gate structure has a first height that extends from a top surface of the first isolation structure to a top surface of the first gate structure. The semiconductor device in the second area comprises: a second isolation structure; a plurality of second channel layers that are formed over the second isolation structure and extend along the first direction; and a second gate structure that wraps around each of the plurality of second channel layers and extends along the second direction. The second gate structure has a second height that extends from a top surface of the second isolation structure to a top surface of the second gate structure. The second height is greater than the first height.

In another aspect of the present disclosure, a semiconductor device is disclosed. The semiconductor device includes a plurality of first stack structures formed in a first area of a substrate, wherein the plurality of first stack structures are configured to form a plurality of first transistors that operate under a first voltage level. The semiconductor device includes a plurality of second stack structures formed in a second area of the substrate, wherein the plurality of second stack structures are configured to form a plurality of second transistors that operate under a second voltage level greater than the first voltage level. The semiconductor device includes a first isolation structure disposed between neighboring ones of the plurality of first stack structures and has a first height. The semiconductor device includes a second isolation structure disposed between neighboring ones of the plurality of second stack structures and has a second height. The first height is greater than the second height.

In yet another aspect of the present disclosure, a method for making a semiconductor device is disclosed. The method includes forming a first fin structure in a first area of a substrate and a second fin structure in a second area of the substrate, wherein a first density of transistors formed in the first area is greater than a second density of transistors formed in the second area. The method includes forming an isolation structure comprising a first portion in the first area and a second portion in the second area, wherein the first portion embeds a lower portion of the first fin structure with a first height and the second portion embeds a lower portion of the second fin structure with a second height. The first height is greater than the second height The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a semiconductor device, comprising:
    forming a first fin structure in a first area of a substrate and a second fin structure in a second area of the substrate, wherein a first density of transistors formed in the first area is greater than a second density of transistors formed in the second area, and wherein the first fin structure includes a first stack of alternating sacrificial layers and channel layers and the second fin structure includes a second stack of the alternating sacrificial layers and channel layers; and
    forming a first isolation structure in the first area and a second isolation structure in the second area, wherein the first isolation structure has a first height and the second isolation structure has a second height, the first height being greater than the second height, and wherein a bottommost sacrificial layer of the first stack is separated from a top surface of the first isolation structure by a first distance and a bottommost sacrificial layer of the second stack is separated from a top surface of the second isolation structure by a second distance, the first distance being less than the second distance.

2. The method of claim 1, wherein forming the first and second fin structures includes:
    forming the alternating sacrificial layers and channel layers over the substrate, the sacrificial layers and the channel layers having different compositions; and
    patterning the alternating sacrificial layers and channel layers to form the first and second stacks corresponding to the first and second fins, respectively.

3. The method of claim 2, wherein forming the alternating sacrificial layers and channel layers includes epitaxially growing each of the sacrificial layers and the channel layers.

4. The method of claim 3, wherein the sacrificial layers are each epitaxially grown to a first thickness and the channel layers are each epitaxially grown to a second thickness greater than the first thickness.

5. The method of claim 1, wherein forming the first and second isolation structures includes:
    depositing an insulation material over the first and second fin structures;
    performing an annealing process to cure the insulation material;
    planarizing the insulation material to expose top surfaces of the first and second fin structures; and
    recessing the insulation material to form the first and second isolation structure structures.

6. The method of claim 1, wherein forming the first and second isolation structures results in the first and second isolation structures each having a concave top surface.

7. The method of claim 1, further comprising:
    forming a first active gate structure over the first fin structure and the first isolation structure, the first active gate structure having a third height that extends from the top surface of the first isolation structure to a top surface of the first active gate structure; and
    forming a second active gate structure over the second fin structure and the second isolation structure, the second active gate structure having a fourth height that extends from the top surface of the second isolation structure to a top surface of the second active gate structure, the fourth height being greater than the third height.

8. A method for making a semiconductor device, comprising:
    forming a first fin structure in a first area of a substrate and a second fin structure in a second area of the substrate, wherein a first density of transistors formed in the first area is greater than a second density of transistors formed in the second area, and wherein the first and second fin structures include a first stack of alternating sacrificial layers and channel layers and a second stack of alternating sacrificial layers and channel layers, respectively;
    forming a first isolation structure in the first area and a second isolation structure in the second area, wherein a bottommost surface of the first stack is separated from a top surface of the first isolation structure by a first distance, and wherein a bottommost surface of the second stack is separated from a top surface of the second isolation structure by a second distance, the second distance being greater than the first distance;
    forming a first source/drain feature in the first fin structure, the first source/drain feature having a first bottom surface; and
    forming a second source/drain feature in the second fin structure, the second source/drain feature having a second bottom surface disposed below the first bottom surface.

9. The method of claim 8, wherein forming the first source/drain feature includes:
    forming a first recess in the first fin structure, the first recess having a first depth measured from a top surface of the first fin structure; and
    epitaxially growing the first source/drain feature in the first recess.

10. The method of claim 9, wherein forming the second source/drain feature includes:
    forming a second recess in the second fin structure, the second recess having a second depth measured from a top surface of the second fin structure, the second depth being greater than the first depth; and
    epitaxially growing the second source/drain feature in the second recess.

11. The method of claim 8, further comprising:
    forming a first dummy gate structure over the first fin structure;
    forming a second dummy gate structure over the second fin structure, wherein the first and second source/drain features are formed adjacent to the first and second dummy gate structures, respectively; and
    replacing the first dummy gate structure and the second dummy gate structure with a first metal gate structure and a second metal gate structure, respectively, after forming the first and second source/drain features, wherein the first metal gate structure extends a third height from the top surface of the first isolation structure to a top surface of the first metal gate structure and the second metal gate structure extends a fourth height from the top surface of the second isolation structure to a top surface of the second metal gate structure, the third height being less than the fourth height.

12. The method of claim 11, wherein the first and second fin structures each include a stack of channel layers vertically separated from one another, and wherein replacing the first and second dummy gate structures includes:
forming an interlayer dielectric (ILD) layer over the first and second source/drain features;
removing the first and second dummy gate structures to form gate trenches; and
forming the first and second metal gate structures in the gate trenches and surrounding each of the channel layers.

13. The method of claim 11, wherein forming the first and second fin structures includes:
forming a stack of the alternating sacrificial layers and channel layers over the substrate, the sacrificial layers and the channel layers having different compositions and different thicknesses; and
patterning the stack to form the first and second fin structures, wherein replacing the first and second dummy gate structures includes replacing the sacrificial layers of each of the first and second fin structures with portions of the first and second metal gate structures, respectively.

14. The method of claim 8, wherein forming the first and second source/drain features results in top surfaces of the first and second source/drain features being horizontally leveled.

15. A method for making a semiconductor device, comprising:
forming a first fin structure in a first area of a substrate and a second fin structure in a second area of the substrate, wherein a first density of transistors formed in the first area is greater than a second density of transistors formed in the second area, and wherein the first and second fin structures include a first stack of alternating sacrificial layers and channel layers and a second stack of alternating sacrificial layers and channel layers, respectively;
forming a first isolation structure in the first area and a second isolation structure in the second area, wherein a bottommost surface of the first stack extends a first distance from a top surface of the first isolation structure, and wherein a bottommost surface of the second stack extends a second distance from a top surface of the second isolation structure, the second distance being greater than the first distance;
forming a first dummy gate structure over the first fin structure;
forming a second dummy gate structure over the second fin structure;
forming a first source/drain feature in the first fin structure adjacent each sidewall of the first dummy gate structure;
forming a second source/drain feature in the second fin structure adjacent each sidewall of the second dummy gate structure; and
replacing the first dummy gate structure and the second dummy gate structure with a first metal gate structure and a second metal gate structure, respectively, wherein the first metal gate structure extends a third height from the top surface of the first isolation structure to a top surface of the first metal gate structure and the second metal gate structure extends a fourth height from the top surface of the second isolation structure to a top surface of the second metal gate structure, the third height being less than the fourth height.

16. The method of claim 15, wherein forming the first and second isolation structures includes:
depositing an insulation material over the first and second fin structures;
performing an annealing process to cure the insulation material;
planarizing the insulation material to expose top surfaces of the first and second fin structures; and
recessing the insulation material to form the first and second isolation structures.

17. The method of claim 15, wherein forming the first source/drain feature includes:
forming a first recess in the first fin structure adjacent each sidewall of the first dummy gate structure, the first recess having a first depth measured from a top surface of the first fin structure; and
epitaxially growing the first source/drain feature in the first recess.

18. The method of claim 17, wherein forming the second source/drain feature includes:
forming a second recess in the second fin structure adjacent each sidewall of the second dummy gate structure, the second recess having a second depth measured from a top surface of the second fin structure, the second depth being greater than the first depth; and
epitaxially growing the second source/drain feature in the second recess.

19. The method of claim 15, wherein forming the first and second source/drain features results in top surfaces of the first and second source/drain features being horizontally leveled.

20. The method of claim 1, further comprising:
forming a first recess in the first fin structure, the first recess having a first depth measured from a top surface of the first fin structure;
epitaxially growing a first source/drain feature in the first recess;
forming a second recess in the second fin structure, the second recess having a second depth measured from a top surface of the second fin structure, the second depth being greater than the first depth; and
epitaxially growing a second source/drain feature in the second recess.

* * * * *